United States Patent
Wakamatsu et al.

(10) Patent No.: US 9,201,990 B2
(45) Date of Patent: Dec. 1, 2015

(54) SIMULATION METHOD, SIMULATION PROGRAM, RECORDING MEDIUM HAVING THE SIMULATION PROGRAM STORED THEREIN, METHOD FOR PRODUCING DROPLET ARRANGEMENT PATTERNS UTILIZING THE SIMULATION METHOD, NANOIMPRINTING METHOD, METHOD FOR PRODUCING PATTERNED SUBSTRATES, AND INK JET APPARATUS

(71) Applicant: FUJIFILM CORPORATION, Minato-ku, Tokyo (JP)

(72) Inventors: Satoshi Wakamatsu, Shizuoka-ken (JP); Takeshi Unemura, Shizuoka-ken (JP); Kenichi Kodama, Shizuoka-ken (JP); Takafumi Noguchi, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 78 days.

(21) Appl. No.: 14/038,268

(22) Filed: Sep. 26, 2013

(65) Prior Publication Data
US 2014/0131313 A1    May 15, 2014

Related U.S. Application Data

(63) Continuation of application No. PCT/JP2012/059618, filed on Apr. 2, 2012.

(30) Foreign Application Priority Data

Mar. 31, 2011  (JP) .................................. 2011-078727

(51) Int. Cl.
*B44C 1/22* (2006.01)
*G06F 17/50* (2006.01)
(Continued)

(52) U.S. Cl.
CPC ............. *G06F 17/5009* (2013.01); *B82Y 10/00* (2013.01); *B82Y 40/00* (2013.01); *G03F 7/0002* (2013.01)

(58) Field of Classification Search
CPC ... G03F 7/0002; G03F 17/5009; B82Y 40/00; G06F 1/03
USPC .......................................... 216/42, 49, 59, 84
See application file for complete search history.

(56) References Cited

U.S. PATENT DOCUMENTS 7,360,851 B1    4/2008  Snyder
2005/0270312 A1  12/2005  Lad et al.
(Continued)

FOREIGN PATENT DOCUMENTS

JP    2005-028277 A    2/2005
JP    2008-502157 A    1/2008
(Continued)

OTHER PUBLICATIONS

H. Schmitt, et al., "UV nanoimprint materials: Surface energies, residual layers, and imprint quality", J. Vac. Sci. Technol. B., Apr. 27, 2007, pp. 785-790, vol. 25, Issue 3.
(Continued)

*Primary Examiner* — Binh X Tran
(74) *Attorney, Agent, or Firm* — Sughrue Mion, PLLC

(57) ABSTRACT

A simulation method predicts wet spreading and unions of a plurality of droplets arranged on a patterned surface defined by a fine pattern of protrusions and recesses, the patterned surface causing anisotropy to occur in the wet spreading of the droplets. The influence imparted by the pattern of protrusions and recesses that defines the patterned surface, which is the target of analysis, on the wet spreading of the droplets is treated as wetting properties of an analysis surface, and the wet spreading and unions of the plurality of droplets on the analysis surface are analyzed by gas liquid two phase flow analysis that incorporates the wetting property parameters that represents the wetting properties.

10 Claims, 11 Drawing Sheets

(51) Int. Cl.
*G03F 7/00* (2006.01)
*B82Y 10/00* (2011.01)
*B82Y 40/00* (2011.01)

(56) References Cited

U.S. PATENT DOCUMENTS

| | | | |
|---|---|---|---|
| 2007/0136042 A1* | 6/2007 | Yu | 703/9 |
| 2007/0250296 A1* | 10/2007 | Shima et al. | 703/2 |
| 2009/0115110 A1 | 5/2009 | Schumaker | |
| 2009/0267268 A1 | 10/2009 | Yoneda et al. | |
| 2011/0008535 A1 | 1/2011 | Mori et al. | |
| 2011/0031650 A1 | 2/2011 | McMackin et al. | |
| 2011/0093241 A1* | 4/2011 | Zhang et al. | 703/2 |
| 2011/0196657 A1* | 8/2011 | Zhang et al. | 703/2 |
| 2011/0238389 A1* | 9/2011 | Zhang | 703/2 |
| 2012/0253767 A1* | 10/2012 | Yoon et al. | 703/9 |
| 2012/0253768 A1* | 10/2012 | Yoon et al. | 703/9 |
| 2013/0227972 A1* | 9/2013 | Hatton et al. | |

FOREIGN PATENT DOCUMENTS

| | | |
|---|---|---|
| JP | 2010-076219 A | 4/2010 |
| JP | 2011-040562 A | 2/2011 |
| JP | 2012-506600 A | 3/2012 |
| WO | 2011/122702 A1 | 10/2011 |

OTHER PUBLICATIONS

H. Kusumaatmaja, et al., "Anisotropic Drop Morphologies on Corrugated Surfaces", Langmuir, Jul. 15, 2008, pp. 7299-7308, vol. 24.
Sharavanthi Reddy, et al., "Simulation of fluid flow in the step and flash imprint lithography process", Microelectronic Engineering, Sep. 1, 2005, pp. 60-70, vol. 82.
H. Kusumaatmaja, et al., "Lattice Boltzmann simulations of drop dynamics", Mathematics and Computers in Simulation, Jul. 23, 2006, pp. 160-164, vol. 72.
M. Rauscher, et al., "Wetting Phenomena in Nanofluidics", Annual Review of Materials Research, Mar. 13, 2008, pp. 143-172, vol. 38.
Ralf Seemann, et al., "Wetting morphologies at microstructured surfaces", Proceedings of the National Academy of Sciences, Feb. 8, 2005, pp. 1848-1852, vol. 102.
Xiu Qing Xing, et al., "Simulation of droplet formation and coalescence using lattice Boltzmann-based single-phase model", Journal of Colloid and Interface Science, May 16, 2007, pp. 609-618, vol. 311.
Decision of Grant issued Jul. 30, 2014, in counterpart Japanese Patent Application No. 2011-078727.

* cited by examiner

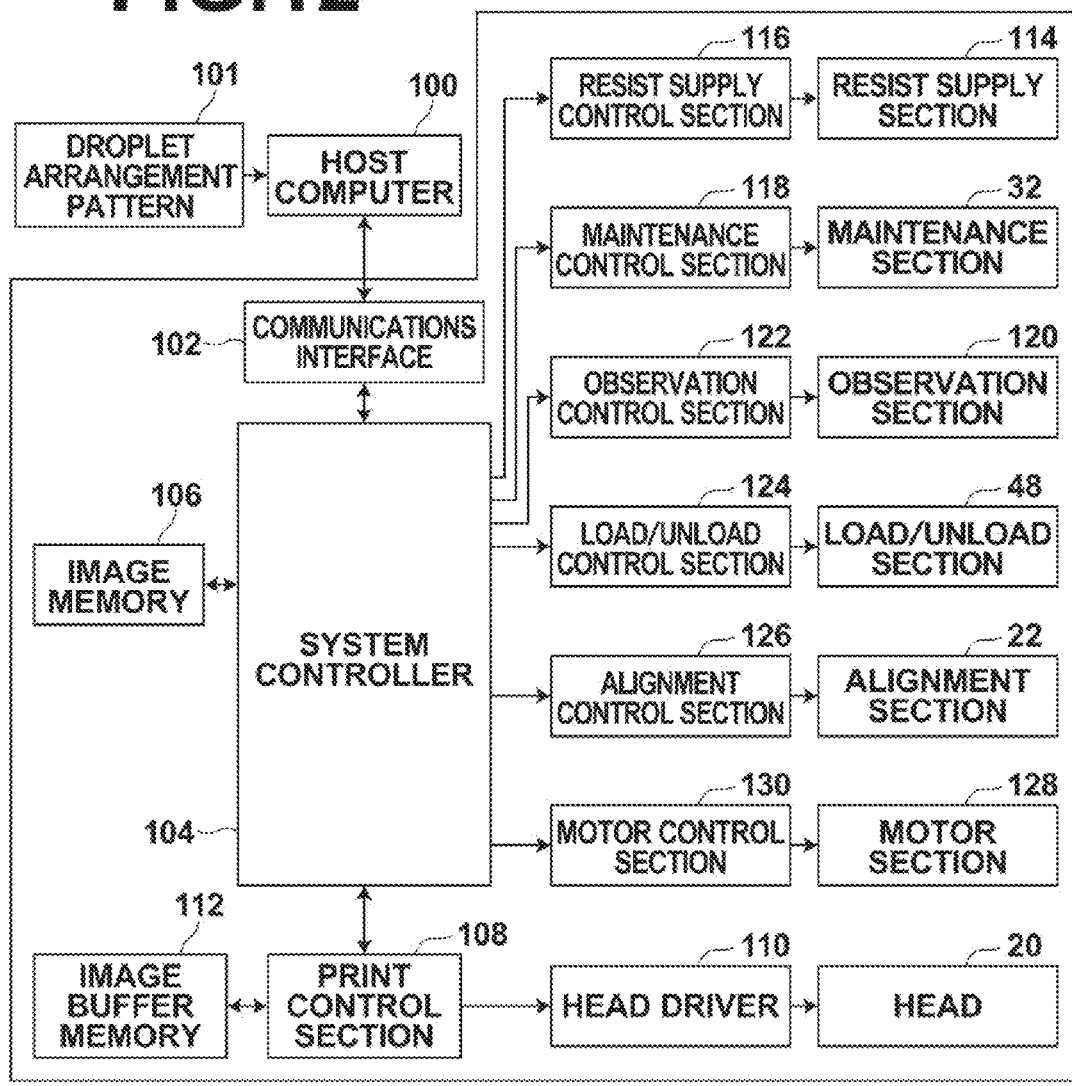

SIMULATION METHOD, SIMULATION PROGRAM, RECORDING MEDIUM HAVING THE SIMULATION PROGRAM STORED THEREIN, METHOD FOR PRODUCING DROPLET ARRANGEMENT PATTERNS UTILIZING THE SIMULATION METHOD, NANOIMPRINTING METHOD, METHOD FOR PRODUCING PATTERNED SUBSTRATES, AND INK JET APPARATUS

This is a Bypass Continuation of PCT/2012/059618 filed Apr. 2, 2012, claiming priority based on JP Application No. 2011-078727, filed Mar. 31, 2011, the contents of all of which are incorporated herein by reference in their entirety.

TECHNICAL FIELD

The present invention is related to a simulation method for predicting wet spreading and unions of a plurality of droplets arranged on a patterned surface defined by a fine pattern of protrusions and recesses, a simulation program, and a recording medium having the simulation program stored therein. The present invention is also related to a method for producing droplet arrangement patterns using the simulation method and the simulation program, a nanoimprinting method, a method for producing patterned substrates, and an ink jet apparatus.

BACKGROUND ART

There are high expectations regarding utilization of pattern transfer techniques that employ a nanoimprinting method to transfer patterns onto resist coated on objects to be processed, in applications to produce magnetic recording media such as DTM (Discrete Track Media) and BPM (Bit Patterned Media) and semiconductor devices.

The nanoimprinting method is a development of the well known embossing technique employed to produce optical discs. In the nanoimprinting method, a mold (commonly referred to as a mold, a stamper, or a template), on which a pattern of protrusions and recesses is formed, is pressed against resist coated on a substrate, which is an object to be processed. Pressing of the original onto the resist causes the resist to mechanically deform or to flow, to precisely transfer the fine pattern. If a mold is produced once, nano level fine structures can be repeatedly molded in a simple manner. Therefore, the nanoimprinting method is an economical transfer technique that produces very little harmful waste and discharge. Therefore, there are high expectations with regard to application of the nanoimprinting method in various fields.

In nanoimprinting, technology for coating substrates to be processed with resist using the ink jet method is being developed.

For example, PCT Japanese Publication No. 2008-502157 discloses a method that employs the ink jet method to control the amount of resist to be coated onto each region of a substrate to be processed, according to the pattern density of each region of a pattern of protrusions and recesses (the percentage of protrusions or recesses per unit area when the pattern of protrusions and recesses is viewed from above) that faces the substrate when the mold is pressed against the substrate. U.S. Patent Application Publication No. 20090267268 discloses a method that employs the ink jet method to control the amount of resist to be coated onto a substrate to be processed according to pattern densities, in order to solve a problem that the volatilization volume of resist differs according to the pattern densities. That is, Patent Documents 1 and 2 disclose methods that employ the ink jet method to optimize positional distributions (droplet arrangement patterns) of droplets of resist on substrates to be processed, on which the droplets are arranged.

DISCLOSURE OF THE INVENTION

However, incomplete filling defects of resist films due to residual gas which is trapped between molds and substrates to be processed are a problem in nanoimprinting methods that employ the ink jet method such as those described above. For example, the methods disclosed in Patent Documents 1 and 2 optimize the intervals among adjacent droplets assuming that wet spreading of the droplets when molds are pressed against the substrates to be processed is isotropic. In regions of patterns of protrusions and recesses at which anisotropic wet spreading occurs, there is a possibility that incomplete filling defects due to residual gas will be generated. If the amount of time that the mold is pressed against the substrate is increased, the influence of residual gas being present can be reduced to a degree, by the residual gas passing through the mold or becoming dissolved in the resist film. However, adopting such a measure cannot completely eliminate incomplete filling defects, and will lead to deterioration in the throughput and efficiency of nanoimprinting steps.

It is considered that the occurrence of incomplete filling defects can be suppressed while improving throughput, by optimizing the arrangement of droplets taking anisotropy in wet spreading of the droplets into consideration as well.

However, it is not simple to optimize the arrangement of droplets by predicting the wet spreading of droplets, as such anisotropy must be taken into consideration. In addition, because anisotropy in wet spreading of the droplets becomes more complex as patterns of protrusions and recesses become complex, it is difficult to predict the wet spreading of the droplets.

In addition, this problem is not only limited to nanoimprinting.

The present invention has been developed in view of the foregoing circumstances. It is an object of the present invention to provide a simulation method, a simulation program, and a computer readable recording medium having the simulation program recorded therein that enable predictions of wet spreading and unions of a plurality of droplets in a simple manner, even in the case that the plurality of droplets are in contact with a patterned surface that causes anisotropy in wet spreading.

It is another object of the present invention to provide a method for producing droplet arrangement patterns that enables droplets to be arranged at optimal positions that take anisotropy in wet spreading of the droplets into consideration.

It is still another object of the present invention to provide a nanoimprinting method that employs the ink jet method that reduces the occurrence of incomplete filling defects due to residual gas, thereby suppressing deterioration in the throughput and efficiency of nanoimprinting steps.

It is still yet another object of the present invention to provide an efficient method for producing a patterned substrate that employs a resist film, onto which a pattern of protrusions and recesses has been transferred by nanoimprinting, as a mask.

It is a further object of the present invention to provide an ink jet apparatus that enables droplets to be arranged at optimal positions that take anisotropy in wet spreading of the droplets into consideration.

A simulation method of the present invention that achieves the above object is a simulation method for predicting wet spreading and unions of a plurality of droplets arranged on a patterned surface defined by a fine pattern of protrusions and recesses, the patterned surface causing anisotropy to occur in the wet spreading of the droplets, characterized by comprising:

a first step that sets an axis direction of the pattern according to the shape of the pattern of protrusions and recesses that defines the patterned surface on a modeled analysis surface of the patterned surface, which is a target of analysis;

a second step that sets a plurality of modeled droplets on the analysis surface;

a third step that refers to a wetting property database that has stored therein wetting property parameters that indicate wetting properties for a plurality of reference patterned surfaces that include the wetting property parameters corresponding to formats of patterns of protrusions and recesses that define the plurality of patterned surfaces;

a fourth step that obtains wetting property parameters that correspond to the format of the pattern of protrusions and recesses that defines the patterned surface, which is the target of analysis, based on the wetting property database;

a fifth step that treats the influence imparted by the pattern of protrusions and recesses that defines the patterned surface, which is the target of analysis, on the wet spreading of droplets as wetting properties of the analysis surface, and analyzes the wet spreading and unions of the plurality of droplets on the analysis surface by gas liquid two phase flow analysis that incorporates the obtained wetting property parameters; and a sixth step that outputs the analysis results obtained in the fifth step as a height distribution of a unified film formed by the plurality of droplets.

In the present specification, the expression "patterned surface" refers to a surface defined by a fine pattern of protrusions and recesses, and is a surface onto which droplets are arranged in real space.

The expression "analysis surface" refers to a surface which is a model of the patterned surface, and is a surface onto which droplets are arranged in an analysis space.

The expression "axis direction of the pattern" refers to a direction within the plane of the patterned surface, and is a longitudinal direction of the protrusions or the recesses that constitute the pattern of protrusions and recesses.

The expression "obtains wetting property parameters . . . based on the wetting property database" refers to obtaining wetting property parameters that correspond to the format of the pattern of protrusions and recesses that defines the patterned surface in the case that such wetting parameters are included in the wetting property database, and refers to obtaining wetting property parameters corresponding to a format that most approximates the format of the pattern of protrusions and recesses, or to calculating wetting property parameters from several formats that approximate the format of the pattern of protrusions and recesses in the case that such parameters are not included in the wetting property database.

The expression "unified film" formed by the plurality of droplets refers to a liquid phase film which is obtained as a result of wet spreading of the plurality of droplets. Portions at which adjacent droplets are united and portions at which single droplets are spread are treated as a single film.

The expression "height distribution" of the unified film refers to a distribution of heights from the analysis surface to a gas liquid interface at positions on the analysis surface.

In the simulation method of the present invention, it is preferable for:

the wetting property parameters to include the value of a contact angle $\theta_{cp}$, which is a contact angle of a contact line at which three phases of gas, liquid, and solid contact each other at a position where a direction of a vector normal to the contact line and the axis direction of the pattern are parallel to each other, and a contact angle $\theta_{cv}$ of the contact line at a position where the direction of the vector normal to the contact line and the axis direction of the pattern are perpendicular to each other; and the fifth step to designate $\theta_c$ obtained by Formula (1) below as contact angles at positions along the contact line and to perform the gas liquid two phase flow analysis incorporating the wetting property parameters by correcting vectors normal to a gas liquid interface at the positions along the contact line such that angles formed by the vectors normal to the gas liquid interface and vectors normal to the analysis surface form the contact angles $\theta_c$ $$\theta_c = \theta_{cp} \cdot |\cos\phi| + \theta_{cv} \cdot |\sin\phi| \qquad (1)$$

wherein $\phi$ represents angles formed by the directions of vectors normal to the contact line and the axis direction of the pattern at positions along the contact line.

In the simulation method of the present invention, it is preferable for:

the second step to arrange a number $n_{init}$ of droplets, which is less than or equal to a maximum number $n_{drop}$ determined by Formula (2) below, as the plurality of droplets;

the simulation method to further comprising a seventh step that adjusts the arrangement of the plurality of droplets on the analysis surface and/or increases the number of the plurality of droplets within a range that does not exceed the maximum number $n_{drop}$ in the case that there are portions having heights that do not match a predetermined threshold height, in the height distribution obtained in the sixth step; and the fifth step through the seventh step to be repeatedly executed with respect to the plurality of droplets, the arrangement of which has been adjusted and/or the number of which has been increased, until there are no portions in the height distribution that have heights that do not match the predetermined threshold height, to optimize the arrangement of the plurality of droplets $$n_{drop} = \text{int}\left(\frac{V_{film}}{V_{drop}}\right) \qquad (2)$$

wherein $V_{film}$ represents a desired volume of the unified film to be formed on the analysis surface, $V_{drop}$ represents the volume of each droplet, and int represents that digits below the decimal point are cut off from the numerical value within the parentheses.

In the present specification, the expression "desired volume of the unified film to be formed on the analysis surface" refers to a volume that corresponds to a desired volume of the unified film to be actually formed on the patterned surface.

The expression "volume of each droplet" refers to the volume of a minimum unit of each droplet when droplets are actually arranged.

It is preferable for the simulation method of the present invention to further comprise:

an eighth step that produces a droplet arrangement pattern based on the optimized arrangement of the plurality of droplets obtained as analysis results by the last fifth step which is executed.

In the present specification, the expression "droplet arrangement pattern" refers to a group constituted by a plurality of lattice points that correspond to positions at which each of the plurality of droplets are to be arranged on the patterned surface which is the target of analysis. The droplet arrangement pattern may be handled as two dimensional coordinate data, such as CAD, that represent the positions of the lattice points, or image data, such as bitmap images.

In the simulation method of the present invention, it is preferable for:

the first step to divide the patterned surface, which is the target of analysis, into a plurality of cells, to model each cell as analysis cells that constitute the analysis surface, and to set the axis direction of the pattern for each analysis cell.

A simulation program of the present invention and a computer readable recording medium having the simulation program recorded therein are characterized by causing a computer to execute the simulation method described above.

A method for producing a droplet arrangement pattern of the present invention is characterized by:

producing a droplet arrangement pattern by the simulation method described above.

A nanoimprinting method of the present invention is characterized by comprising the steps of:

arranging a plurality of droplets of a curable resin according to a droplet arrangement pattern produced by the simulation method described above onto a surface to be processed of a processing target substrate by the ink jet method;

pressing a mold having a patterned surface, which is a target of analysis, against the plurality of droplets arranged on the surface to be processed while the patterned surface and the surface to be processed face each other, to form a curable resin film on the surface to be processed;

curing the curable resin film; and separating the mold from the cured resin film.

A method for producing a patterned substrate of the present invention is characterized by comprising the steps of:

forming a resist film constituted by cured resin, on which a pattern of protrusions and recesses of a mold is transferred by the nanoimprinting method described above, onto a substrate to be processed; and performing dry etching using the resist film as a mask to form a pattern of protrusions and recesses corresponding to the pattern of protrusions and recesses transferred to the resist film on the substrate to be processed, to obtain a patterned substrate.

An ink jet apparatus of the present invention is characterized by comprising:

a computer readable recording medium having recorded therein a simulation program that causes a computer to execute the simulation method described above.

The simulation method, the simulation program, and the recording medium having the simulation program recorded therein of the present invention are simulation methods for predicting wet spreading and unions of a plurality of droplets arranged on a patterned surface defined by a fine pattern of protrusions and recesses, the patterned surface causing anisotropy to occur in the wet spreading of the droplets, characterized by comprising: a first step that sets an axis direction of the pattern according to the shape of the pattern of protrusions and recesses that defines the patterned surface on a modeled analysis surface of the patterned surface, which is a target of analysis; a second step that sets a plurality of modeled droplets on the analysis surface; a third step that refers to a wetting property database that has stored therein wetting property parameters that indicate wetting properties for a plurality of reference patterned surfaces that include the wetting property parameters corresponding to formats of patterns of protrusions and recesses that define the plurality of patterned surfaces; a fourth step that obtains wetting property parameters that correspond to the format of the pattern of protrusions and recesses that defines the patterned surface, which is the target of analysis, based on the wetting property database; a fifth step that treats the influence imparted by the pattern of protrusions and recesses that defines the patterned surface, which is the target of analysis, on the wet spreading of droplets as wetting properties of the analysis surface, and analyzes the wet spreading and unions of the plurality of droplets on the analysis surface by gas liquid two phase flow analysis that incorporates the obtained wetting property parameters; and a sixth step that outputs the analysis results obtained in the fifth step as a height distribution of a unified film formed by the plurality of droplets. The present invention treats the influence imparted by the pattern of protrusions and recesses of a patterned substrate, which is the target of analysis, on the wet spreading of droplets as wetting properties of the analysis surface. Therefore, simulations can be executed by treating the analysis surface as a flat surface having particular wetting properties without performing complex analysis of the fine pattern of protrusions and recesses and the droplets. As a result, it becomes possible to predict of wet spreading and unions of a plurality of droplets in a simple manner, even in the case that the plurality of droplets are in contact with a patterned surface that causes anisotropy in wet spreading.

The method for producing a droplet arrangement pattern of the present invention is characterized by the step of producing a droplet arrangement pattern by the simulation method described above. Thereby, it becomes possible to arrange droplets at optimal positions that take anisotropy into consideration, even in the case that the plurality of droplets are to be arranged on a patterned surface that causes anisotropy in wet spreading.

The nanoimprinting method of the present invention is particularly characterized by the step of arranging a plurality of droplets of a curable resin according to a droplet arrangement pattern produced by the simulation method described above onto a surface to be processed of a processing target substrate by the ink jet method. Thereby, droplets can be arranged at optimal positions that take anisotropy into consideration, even in the case that the plurality of droplets are to be arranged on a patterned surface that causes anisotropy in wet spreading. As a result, the occurrence of incomplete filling defects due to residual gas can be reduced, and it becomes possible to suppress deterioration in the throughput and efficiency of nanoimprinting steps.

The method for producing a patterned substrate of the present invention is particularly characterized by the step of forming a resist film constituted by cured resin, on which a pattern of protrusions and recesses of a mold is transferred by the nanoimprinting method described above, onto a substrate to be processed. Thereby, the resist film can be formed on the substrate to be processed while suppressing deterioration in the throughput and efficiency of nanoimprinting steps. As a result, it becomes possible to efficiently produce patterned substrates employing a resist film, onto which a pattern of protrusions and recesses has been transferred by nanoimprinting, as a mask.

The ink jet apparatus of the present invention is characterized by comprising a computer readable recording medium having recorded therein a simulation program that causes a computer to execute the simulation method described above. Thereby, it becomes possible to arrange droplets at optimal positions that take anisotropy into consideration, even in the case that the plurality of droplets are to be arranged on a patterned surface that causes anisotropy in wet spreading.

BRIEF DESCRIPTION OF THE DRAWINGS

FIG. 12 is a schematic diagram that illustrates the configuration of a control system of the ink jet apparatus of FIG. 10.

BEST MODE FOR CARRYING OUT THE INVENTION

Figure 1:
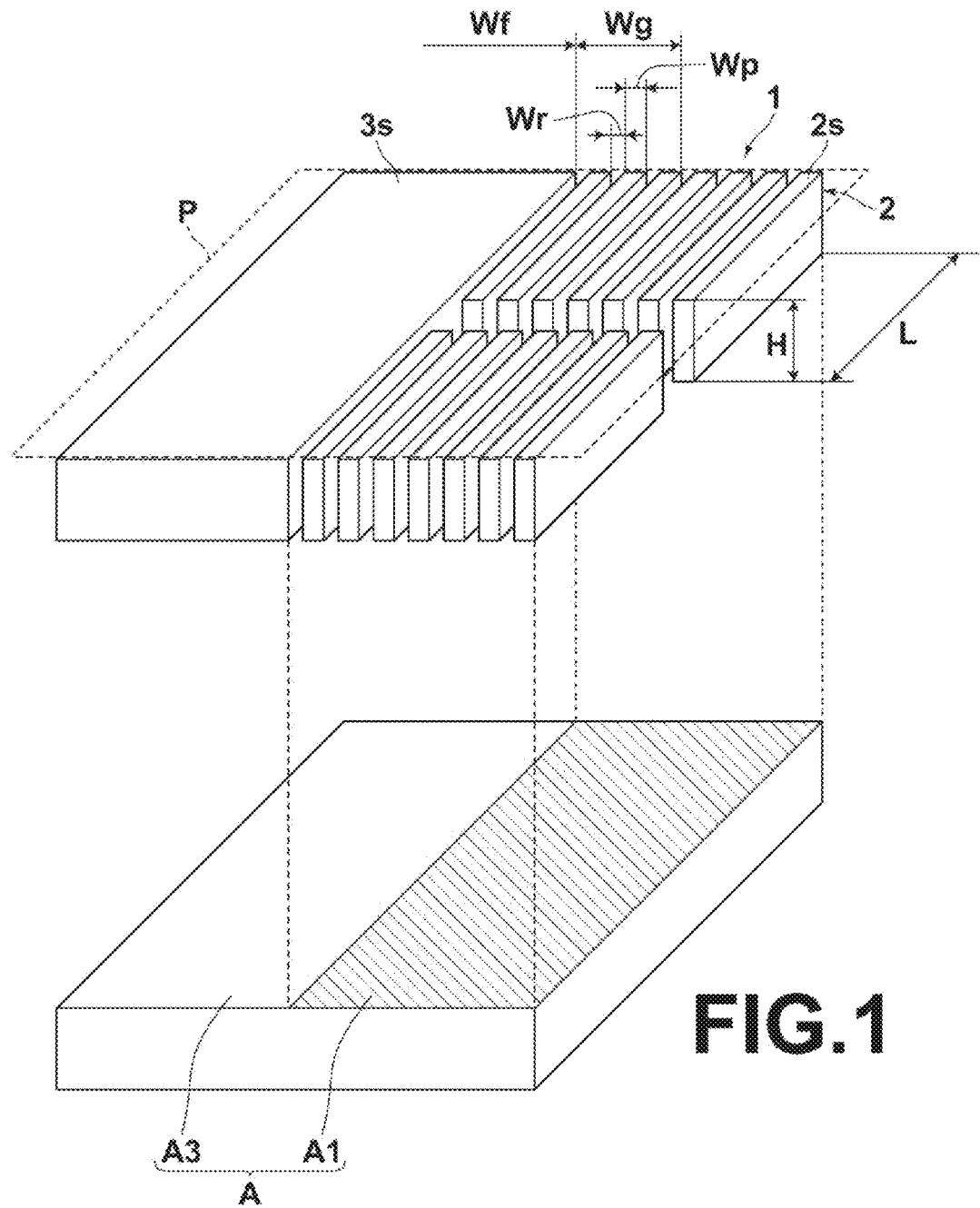
FIG. 1 is a schematic diagram that illustrates a patterned surface, which is a target of analysis, and an analysis surface, which is a model of the patterned surface.

Hereinafter, embodiments of the present invention will be described with reference to the attached drawings. However, the present invention is not limited to the embodiments to be described below. Note that in the drawings, the dimensions of the constitutive elements are drawn differently from the actual dimensions thereof, in order to facilitate visual recognition thereof.

Simulation Method, Simulation Program, and Computer Readable Recording Medium Having the Simulation Program Recorded Therein First Embodiment First, a simulation method, a simulation program, and a computer readable medium having the simulation program recorded therein according to a first embodiment of the present invention will be described. FIG. 1 is a schematic diagram that illustrates a patterned surface P which is a target of analysis, and an analysis surface A, which is a model of the patterned surface P.

The simulation method of the first embodiment is a simulation method for predicting wet spreading and unions of a plurality of droplets arranged on the patterned surface P defined by a fine pattern 1 of protrusions and recesses, the patterned surface P causing anisotropy to occur in the wet spreading of the droplets. The format of the pattern 1 of protrusions and recesses that defines the patterned surface P, which is the target of analysis, and the density, the viscosity coefficient and the surface tension of the material of the droplets to be arranged on the patterned surface P are obtained as necessary parameters. The contact angle of the droplets with respect to a planar surface formed by the material of the pattern 1 of protrusions and recesses, or a combination of an interface tension between the material of the droplets and the material of the pattern 1 of protrusions and recesses and the surface tension of the material of the pattern 1 of protrusions and recesses is obtained as an optional parameter. Thereafter, the simulation method executes: a first step that sets an axis direction Dp of the pattern according to the shape of the pattern 1 of protrusions and recesses that defines the patterned surface P on the modeled analysis surface A of the patterned surface P, which is the target of analysis; a second step that sets a plurality of modeled droplets on the analysis surface A; a third step that refers to a wetting property database that has stored therein wetting property parameters that indicate wetting properties for a plurality of reference patterned surfaces that include the wetting property parameters corresponding to formats of patterns of protrusions and recesses that define the plurality of patterned surfaces; a fourth step that obtains wetting property parameters that correspond to the format of the pattern 1 of protrusions and recesses that defines the patterned surface P, which is the target of analysis, based on the wetting property database; a fifth step that treats the influence imparted by the pattern 1 of protrusions and recesses that defines the patterned surface P, which is the target of analysis, on the wet spreading of droplets as wetting properties of the analysis surface A, and analyzes the wet spreading and unions of the plurality of droplets on the analysis surface A by gas liquid two phase flow analysis that incorporates the obtained wetting property parameters; and a sixth step that outputs the analysis results obtained in the fifth step as a height distribution of a unified film formed by the plurality of droplets.

The simulation program and the computer readable recording medium having the simulation program recorded therein of the first embodiment cause a computer to execute the simulation program described above.

The simulation method of the present invention may be utilized as a method for predicting how a plurality of droplets on a substrate to be processed will wet spread and unify in the case that a mold having a fine pattern of protrusions and recesses formed on the surface thereof is employed to execute nanoimprinting by the ink jet method, for example. In such cases, the surface of the mold on which the pattern of protrusions and recesses is formed corresponds to the patterned surface of the present invention. A plurality of droplets of curable resin which are coated by the ink jet method correspond to the plurality of droplets of the present invention.

In the case that nanoimprinting is actually executed, generally, droplets are arranged on a flat surface of a substrate to be processed, and then a pattern of protrusions and recesses of a mold is pressed against the droplets. In analysis by simulation, however, modeling is performed assuming a case in which the droplets are arranged on the patterned surface. This is because it is considered that gravity of the droplets can be substantially ignored at the step where the pattern of protrusions and recesses is pressed against the droplets to cause the droplets to undergo wet spreading. That is, there is no great difference in the two cases, as droplets undergo wet spreading while in contact with the patterned surface that causes anisotropic wet spreading.

(Parameters to be Utilized in Analysis by Simulation)

In the analysis of the first embodiment, the format of the pattern 1 of protrusions and recesses that defines the patterned surface P, which is the target of analysis, and the density, the viscosity coefficient and the surface tension of the material of the droplets to be arranged on the patterned surface P are obtained as necessary parameters. In addition, the contact angle of the droplets with respect to a planar surface formed by the material of the pattern 1 of protrusions and recesses, or a combination of an interface tension between the material of the droplets and the material of the pattern 1 of protrusions and recesses and the surface tension of the material of the pattern 1 of protrusions and recesses is obtained as an optional parameter. With respect to the optional parameter, the contact angle and the combination are interchangeable. Therefore, only one of the optional parameters is necessary.

In the present specification, the expression "contact angle of the droplets with respect to a planar surface formed by the material of the pattern of protrusions and recesses" refers to a contact angle of the droplets, which is determined by a relationship between the material of the droplets and the material of the pattern of protrusions and recesses. In addition, the expression "interface tension between the material of the droplets and the material of the pattern of protrusions and recesses" refers to an interface tension at the interface between the material of the droplets and the material of the pattern of protrusions and recesses, which is determined by a relationship between the materials.

(Patterned Surface)

The patterned surface is a surface which is defined by a pattern of protrusions and recesses (pattern 1 of protrusions and recesses) constituted by fine recesses and fine protrusions, and is the target of modeling as a surface on which the droplets are arranged. In the first embodiment, the patterned surface P is a smoothly continuous surface P that includes the upper surfaces 2s of protrusions 2 of the pattern 1 of protrusions and recesses, as illustrated in FIG. 1. In the case that a smooth surface 3s on which the pattern 1 of protrusions and recesses is not formed is included, the patterned surface P is defined to reflect such a smooth surface 3s as well. A direction within the plane of the patterned surface P, which is the longitudinal direction of the protrusions or the recesses that constitute the pattern 1 of protrusions and recesses, is set as the axis direction Dp of the pattern. Specifically, with respect to the protrusions and recesses that constitute the pattern of protrusions and recesses, in the case that it is recognized that a protrusion is surrounded by recesses, the longitudinal direction of the protrusion is set as the axis direction Dp of the pattern. In the case that it is recognized that a recess is surrounded by protrusions, the longitudinal direction of the recess is set as the axis direction Dp of the pattern. In the case that there are a plurality of longitudinal directions of the protrusions or recesses due to the protrusions or recesses bending and the like, an appropriate direction may be selected by weighting the directions, or the patterned surface P may be divided at portions where the longitudinal directions change. In the case that the pattern 1 of protrusions and recesses is linear, it is considered that wet spreading of droplets is facilitated along the axis direction Dp of the pattern. Therefore, anisotropy occurs in the wet spreading of droplets on the patterned surface P. In the case of a simple model in which the shape of a droplet that undergoes wet spreading on the patterned surface P approximates an ellipse due to the anisotropy in wet spreading, the direction of the long axis of the ellipse and the axis direction Dp of the pattern at this point will be substantially parallel.

Figure 2A:
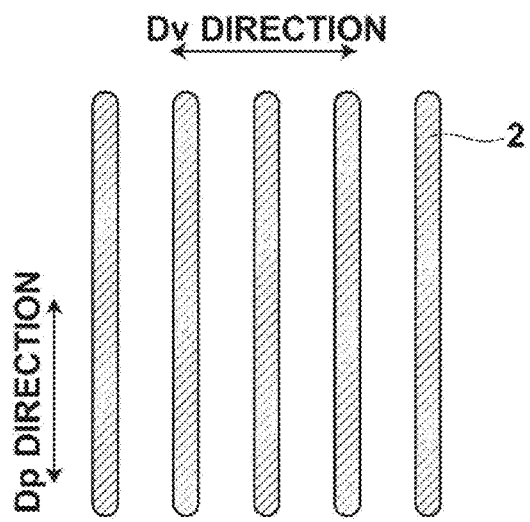
FIGS. 2A-2D are a collection of diagrams that illustrate examples of patterns which are linear patterns of protrusions and recesses and a pattern which is not a linear pattern of protrusions and recesses.
Figure 2B:
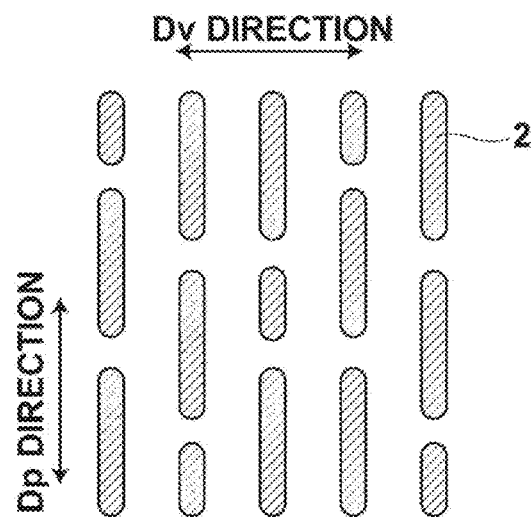
Figure 2C:
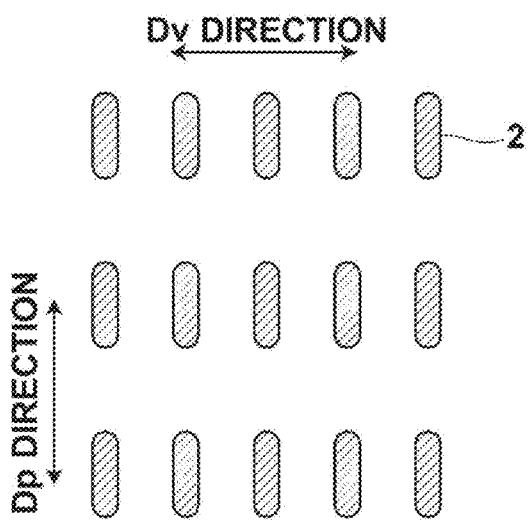
Figure 2D:
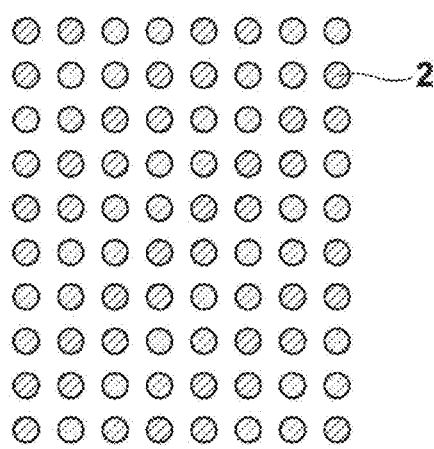

For example, FIGS. 2A through 2C illustrate examples of patterns of protrusions and recesses that cause anisotropic wet spreading of droplets. FIG. 2A, FIG. 2B, and FIG. 2C are schematic diagrams that illustrate patterns of protrusions and recesses of the line and space type, constituted by pluralities of elongate protrusions 2 which are arranged such that the longitudinal directions thereof are oriented in a predetermined direction. In such patterns 1 of protrusions and recesses, it is easier for arranged droplets to spread within spaces between protrusions 2 and adjacent protrusions 2 (that is, recesses), and therefore, anisotropy occurs in the wet spreading of the droplets. It is recognized that the protrusions are surrounded by recesses in the patterns of protrusions and recesses of FIG. 2A, FIG. 2B, and FIG. 2C. Accordingly, the longitudinal directions of the elongate protrusions 2 are the axis directions Dp of the patterns. In FIGS. 2A, 2B, and 2C, Dv denotes directions perpendicular to the axis directions Dp of the patterns. Note that FIG. 2D is a schematic diagram that illustrates a pattern in which dot shaped protrusions 2 are uniformly arranged in the vertical and horizontal directions. In such a case, anisotropy is not clearly exhibited in the wet spreading directions of droplets. Therefore, this pattern is not included in the definition of a pattern that causes anisotropy in the wet spreading of droplets as used in the present specification.

The manner of anisotropy changes depending on the format of the pattern 1 of protrusions and recesses. Specifically, the manner of isotropy changes depending on basic elements that define the scale of the pattern 1 of protrusions and recesses. That is, in the case that protrusions 2 are independent as illustrated in FIGS. 2A, 2B, and 2C, the manner of anisotropy changes depending on the widths Wp of the protrusions 2, the intervals Wr among the protrusions, the heights H of the protrusions 2 and the lengths L of the protrusions 2. Further, the manner of anisotropy differs according to the manner in which a plurality of protrusions 2 having the same or different basic elements are arranged. In the case that recesses are independent, the basic elements that define the scale of the pattern 1 of protrusions and recesses are the widths of the recesses, the intervals among the recesses, the depths of the recesses, and the lengths of the recesses.

FIGS. 2A through 2C illustrate patterns of protrusions and recesses in which the axis direction Dp of the pattern can be unambiguously determined. However, the pattern 1 of protrusions and recesses of the present invention is not limited to those in which the axis direction Dp of the pattern can be unambiguously determined.

Figure 3A:
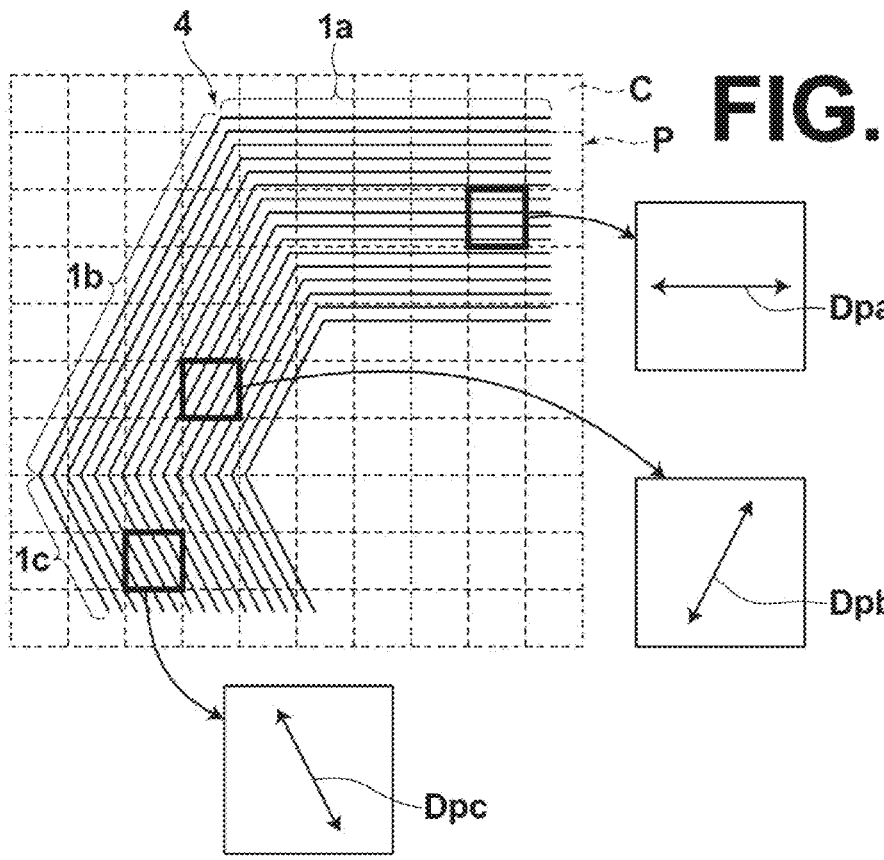
FIG. 3A is a conceptual diagram that illustrates a patterned surface divided into a plurality of cells.

FIG. 3A is a conceptual diagram that illustrates a patterned surface divided into a plurality of cells. For example, in the case of a pattern 4 of protrusions and recesses, which is a combination of straight linear patterns 1a, 1b, and 1c of protrusions and recesses each having an axis direction Dp, a patterned surface P which is a target of analysis may be divided into a plurality of cells C, and axis directions Dpa, Dpb, and Dpc may be set based on the shapes of the patterns of protrusions and recesses in each cell C (FIG. 3A). More accurate analysis of the movement of droplets is enabled by setting the axis direction Dp of the pattern for each cell C. It is not necessary for sizes and divided shape to be the same for all of the cells C. For example, the patterned surface P may be divided into cells C corresponding to each region in which the axis direction Dp of the pattern is the same. In the case that the shape of the pattern 1 of protrusions and recesses that define the patterned surface P is complex (a case in which the protrusions are formed as curved lines and the recesses are arranged as curved lines, for example), the patterned surface P may be divided into a plurality of fine cells, in each of which the pattern can be judged to be a straight linear pattern, and the axis direction of the pattern may be set for each cell.

(Modeling of the Patterned Surface)

In the simulation method of the present invention, the patterned surface P, which is the target of analysis in actual space, is modeled as the analysis surface A to perform analysis. Modeling of the patterned surface P in the simulation method of the present invention is characterized by treating regions of the patterned surface P at which fine patterns 1 of protrusions and recesses having scales smaller than a resolution Wg, based on a computational grid or computational elements, as surfaces A1 having predetermined anisotropic wetting properties, as illustrated in FIG. 1. In addition, the smooth surface 3s at which the pattern 1 of protrusions and recesses is not formed is treated as a surface A3 having predetermined isotropic wetting properties in an analysis space.

In fluid analysis by simulations, generally, equations are established for each computational grid or for each computational element. The computational grid or the computational element represent the smallest unit when solving the equations related to fluids, and are finely divided elements of the analysis space at where the fluids may be present. In the case that the elements are regularly divided in a vertical and horizontal mesh pattern, the elements are referred to as a computational grid. In the case that the elements are divided irregularly as triangles and polygons, the elements are referred to as computational elements. The equations related to the fluids are solved approximately for each computational grid or computational element thereof (hereinafter, simply referred to as "computational grid"). That is, the accuracy of calculations is improved as the computational grid becomes finer, and the movement of the fluids can be more accurately expressed.

However, if the resolution Wg based on the computational grid is made smaller in order to perform analysis taking the shape of the fine pattern of protrusions and recesses into strict consideration, the number of computational grids will become extremely great, and there is a problem that calculations will become complex.

Therefore, the present invention sets a predetermined computational grid having a resolution sufficiently greater than the size of the scale of the pattern 1 of protrusions and recesses, and the pattern 1 of protrusions and recesses having a scale less than the resolution of the computational grid is modeled and incorporated into the analysis surface A as wetting properties of droplets. That is, the contribution of the pattern 1 of protrusions and recesses having a scale less than the resolution of the computational grid is reproduced as differences in the wetting properties of droplets on the analysis surface A. Meanwhile, patterns of protrusions and recesses having various spatial scales are present on the patterned surface. Therefore, portions having scales greater than the resolution of the computational grid are reproduced as shapes of the analysis surface A. Two patterns of protrusions and recesses having different scales may be combined and modeled simultaneously, then analysis may be performed as a whole. However, it is preferable for analysis to be performed for each analysis surface in the case that stepped differences are present among analysis surfaces.

Figure 3B:
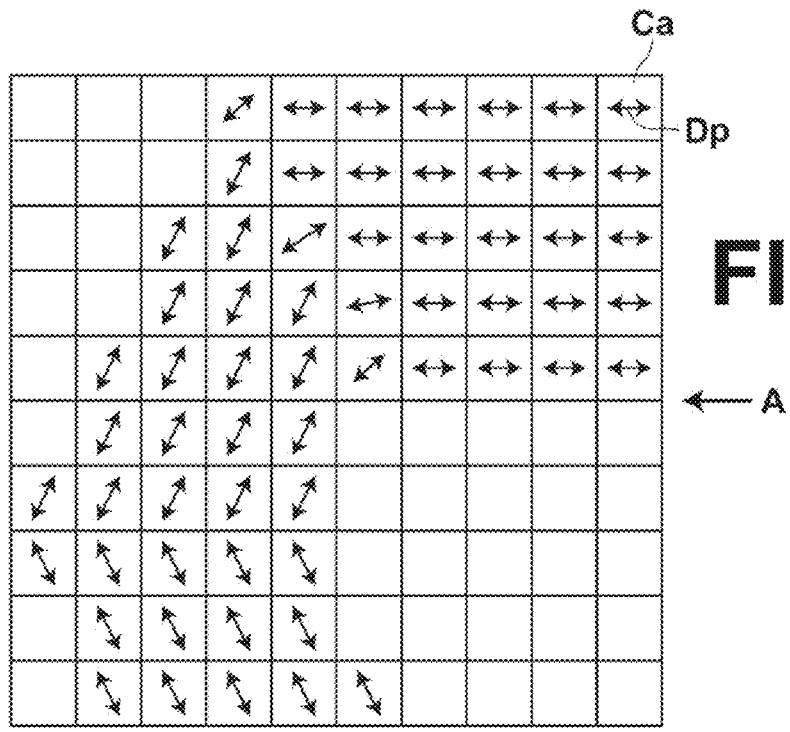
FIG. 3B is a conceptual diagram that illustrates the manner in which axis directions of a pattern are set in a plurality of analysis surface cells.

In the case that the patterned surface P is divided into the plurality of cells C, it is preferable for plurality of cells Ca that constitute the analysis surface A to be set for each of the cells C. That is, in this case, each cell C is modeled into an analysis cell Ca, as illustrated in FIG. 3B.

(Wetting Property Parameters and Wetting Property Database)

The wetting properties modeled as described above change depending on the format of the pattern 1 of protrusions and recesses, the surface tension (surface energy) of the droplets, and the surface tension (surface energy) of the patterned surface P. Therefore, the present invention prepares a wetting property database that has stored therein wetting property parameters that indicate wetting properties for a plurality of reference patterned surfaces. The wetting property parameters are stored in the database correlated to formats of patterns of protrusions and recesses that define the plurality of patterned surfaces. The database is searchable at least based on the formats of patterns of protrusions and recesses.

Table 1 below illustrates an example of a wetting property database. For example, in the database of Table 1, contact angles are correlated with the formats of reference patterns of protrusions and recesses, the surface energies of droplets, and the surface energies of patterned surfaces P and stored as wetting property parameters. Contact angle $\theta_{cp}$ in Table 1 is a contact angle of a contact line at which three phases of gas, liquid, and solid contact each other at a position where a direction of a vector normal to the contact line and the axis direction of the pattern are parallel to each other. Contact angle $\theta_{cv}$ is a contact angle of the contact line at a position where the direction of the vector normal to the contact line and the axis direction of the pattern are perpendicular to each other.

TABLE 1

| Format of Pattern of Protrusions and Recesses | | | | Physical Properties | Physical Properties of Patterned | Wetting Property Parameters | |
|---|---|---|---|---|---|---|---|
| Width of Protrusions Wp (nm) | Intervals Among Protrusions Wr (nm) | Height of Protrusions H (nm) | Length of Protrusions L (mm) | of Droplets Surface Energy (mN/m) | Surface Surface Energy (mN/m) | Contact Angle $\theta_{cp}$ (°) | Contact Angle $\theta_{cv}$ (°) |
| n/a | n/a | n/a | 3 | 25 | 15 | 60 ± 2 | 60 ± 2 |
| 30 | 30 | 30 | 3 | 25 | 15 | 54 ± 3 | 78 ± 4 |
| 30 | 30 | 60 | 3 | 25 | 15 | 50 ± 4 | 85 ± 5 |
| 30 | 60 | 30 | 3 | 25 | 15 | 57 ± 2 | 70 ± 3 |
| 30 | 60 | 60 | 3 | 25 | 15 | 52 ± 3 | 80 ± 3 |
| 60 | 30 | 30 | 3 | 25 | 15 | 56 ± 2 | 71 ± 3 |
| 60 | 30 | 60 | 3 | 25 | 15 | 51 ± 4 | 79 ± 3 |
| 60 | 60 | 30 | 3 | 25 | 15 | 58 ± 3 | 64 ± 3 |
| 60 | 60 | 60 | 3 | 25 | 15 | 55 ± 3 | 80 ± 5 |

The anisotropy of wet spreading of droplets is reproduced as anisotropy of the wetting properties on the analysis surface A, by employing the two contact angles in analysis. The contact angles at other positions along the contact line are calculated based on the two contact angles. Note that it is not necessary for the wetting property database to include the physical properties of the droplets and the physical properties of the patterned surface P in the case that a wetting property database dedicated to specific physical properties is generated.

The contact angles employed as the wetting property parameters will constantly be equilibrium contact angles in the case that an equilibrium contact angle model is utilized as the wetting properties. On the other hand, in the case that a contact angle history model is utilized, a forwardly progressing contact angle is utilized when the movement speed vector of the contact line is oriented from the liquid phase side to the gas phase side, and a receding contact angles is utilized when the movement speed vector of the contact line is oriented from the gas phase side to the liquid phase side.

Hereinafter, each step of the simulation method of the present invention will be described.

(First Step)

The first step sets an axis direction Dp of the pattern according to the shape of the pattern 1 of protrusions and recesses that defines the patterned surface P on the modeled analysis surface A of the patterned surface P, which is a target of analysis. In the case that the patterned surface P is divided into a plurality of cells C, an axis direction Dp is set for each of a plurality of analysis cells Ca of the analysis surface A (FIG. 3B).

(Second Step)

The second step sets a plurality of modeled droplets on the analysis surface. The droplets are arranged in each of a plurality of drop sites (regions divided into an m·n lattice) on the analysis surface A. m and n are the largest integers into which the analysis surface A can be divided, based on the relationship with elements that define the resolution of a droplet arranging means (the head pitch and the expulsion period of an ink jet head, for example). Two or more droplets may be arranged at the same drop site. In this case, the droplet amount at the drop site is treated as being greater than the droplet amount at other drop sites. The drop sites are different concepts from the previously described computational grid and analysis cells.

(Third Step)

The third step refers to the wetting property database to obtain wetting property parameters.

(Fourth Step)

The fourth step obtains wetting property parameters that correspond to the format of the pattern 1 of protrusions and recesses that defines the patterned surface P, which is the target of analysis, based on the wetting property database. First, average values are calculated for each of the widths Wp of the protrusions 2, the intervals Wr among protrusions, the heights H of the protrusions 2, and the lengths L of the protrusions 2 of the pattern 1 of protrusions and recesses. The calculated average values define the format of the pattern 1 of protrusions and recesses. Next, wetting property parameters corresponding to the obtained format of the pattern 1 of protrusions and recesses are searched for within the wetting property database, and set for the analysis surface A. Note that in the case that the patterned surface P is divided into a plurality of cells C, the aforementioned average values are calculated for each of the cells C, and wetting property parameters are set for each of the cells C. Thereby, a wetting property distribution is set for the analysis surface A.

In the case that data regarding a format that matches the format of the pattern 1 of protrusions and recesses that defines the patterned surface P is not included in the wetting property database, wetting property parameters corresponding to a format that most approximates the format of the pattern 1 of protrusions and recesses may be obtained. Alternatively, approximate values (average values, for example) may be calculated from wetting property parameters corresponding to several formats that approximate the format of the pattern 1 of protrusions and recesses as the wetting property parameters.

The order of the first step, the second step, and the combination of the third and fourth steps may be switched.

(Fifth Step)

The fifth step treats the influence imparted by the pattern 1 of protrusions and recesses that defines the patterned surface P, which is the target of analysis, on the wet spreading of droplets as wetting properties of the analysis surface A, and analyzes the wet spreading and unions of the plurality of droplets on the analysis surface A by gas liquid two phase flow analysis that incorporates the obtained wetting property parameters.

The gas liquid two phase flow analysis is executed as follows.

When predicting wet spreading and unions, the behavior of the interface between liquid and gas (gas liquid interface) is predicted employing three dimensional gas liquid two phase flow analysis. Examples of calculation methods for gas liquid two phase flow analysis include: the MAC (Marker And Cell) method; the ALE (Arbitrary Lagrangian Eularian) method; and the VOF (Volume Of Fluid) method. Hereinafter, a case will be described in which the VOF method is employed to perform analysis.

Figure 4:
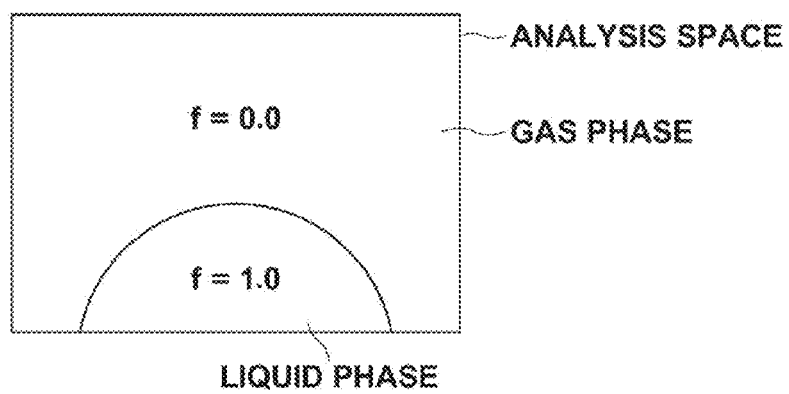
FIG. 4 is a conceptual diagram that illustrates the manner in which a fluid rate is set in analysis.

Values for a fluid rate f are set within an analysis space. As illustrated in FIG. 4, the fluid rate f assumes a value of f=0.0 at a region within the analysis space occupied by gas or a vacuum (gas phase), assumes a value of f=1.0 at a region within the analysis space occupied by a liquid (liquid phase), and represents the percentage of the liquid phase at each position within the analysis space. In gas liquid two phase flow analysis using the VOF method, first, a fluid speed u and a pressure p at each position within the analysis space are calculated by the Navier-Stokes equation that incorporates the surface tension $F_s$ at the gas liquid interface, gravity G, and other external forces $F_{ext}$ indicated as Formula (3) below and by Formula (4) below.

$$\frac{\partial u}{\partial t} + (u \cdot \nabla)u = \frac{1}{\rho}\nabla p + \frac{\mu}{\rho}\nabla^2 u + F_s + G + F_{ext} \quad (3)$$

$$\nabla \cdot u = 0 \quad (4)$$

In Formula (3), $\rho$ represents a fluid density at each position, and $\mu$ represents a viscosity coefficient of fluid at each position.

The present embodiment assumes an uncompressed fluid. Next, it is considered that the fluid and the gas are transported at the fluid speed u, a transport equation of the fluid rate f indicated as Formula (5) below is solved, and the distribution of the fluid rate F within the analysis space is calculated.

$$\frac{\partial f}{\partial t} + u \cdot \nabla f = 0 \quad (5)$$

The fluid density ρ and the viscosity coefficient μ are calculated from the fluid rate f, the density $\rho_g$ of the gas, the density $\rho_l$ of the liquid, the viscosity coefficient $\mu_g$ of the gas, and viscosity coefficient $\mu_l$ of the liquid, by Formula (6) and Formula (7) below.

$$\rho = (1-f)\cdot\rho_g + f\cdot\rho_l \tag{6}$$

$$\mu = (1-f)\cdot\mu_g + f\cdot\mu_l \tag{7}$$

Temporal changes in the liquid phase within the analysis space can be predicted by performing the above analysis for each amount of elapsed time t. A CSF (Continuum Surface Force) model is assumed to calculate the surface tension $F_s$ in the Navier Stokes equation of Formula (3). This model enables the surface tension $F_s$ to be calculated as a volume force from the distribution of fluid rate f using Formula (8) and Formula (9) below.

$$F_s = \frac{\sigma \kappa \rho \nabla f}{\langle \rho \rangle} \tag{8}$$

$$\kappa = \frac{1}{|n|}\left[\left(\frac{n}{|n|}\cdot\nabla\right)|n| - (\nabla\cdot n)\right] \tag{9}$$

In Formula (8), σ represents a surface tension coefficient of the liquid, and <ρ> represents an average value of the liquid density and the gas density at each position. K represents the curvature of the gas liquid interface, and is obtained by Formula (9) employing a vector n normal to the gas liquid interface.

As described above, the gas liquid two phase flow analysis is performed using Formulas (3) through (8) as a basic equation system, and the dynamic behavior of the gas liquid interface can be predicted. In actual analysis of numerical values, the analysis space is divided into a plurality of computational grids, and calculations are performed by discretizing the equation system according to the limited volume method.

Figure 5:
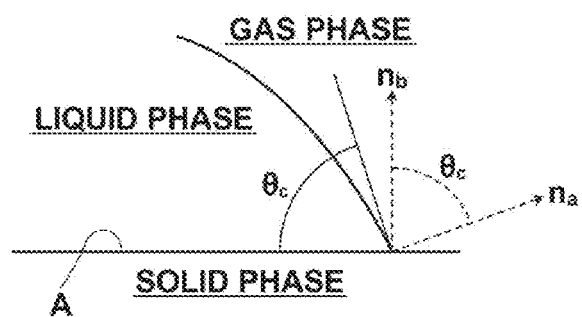
FIG. 5 is a conceptual diagram that illustrates contact angles in analysis.

In a simulation method for predicting wet spreading and unions of a plurality of droplets, reproduction of the behavior of a triphasic interface among a solid, a liquid, and a gas on the analysis surface A, that is, the contact line, is important. In the present invention, the behavior analysis of the contact line takes the anisotropy in wet spreading of droplets due to the patterned surface into consideration. This is realized by causing the wetting property parameters to have distributions corresponding to the anisotropy on the analysis surface A. In the aforementioned gas liquid two phase flow analysis, the wetting properties between a solid and a liquid is modeled as boundary conditions on the analysis surface A. As illustrated in FIG. 5, the present embodiment introduces a model that treats a contact angle $\theta_c$ as a wetting property parameter, and treats the influence of the pattern 1 of protrusions and recesses that defines the patterned surface P as wetting properties based on contact angles.

A contact angle is set between the analysis surface A and a droplet as a simulation condition. In common analysis methods, wetting properties are reflected in the transport of fluid rates by correcting vectors $n_a$ normal to the gas liquid interface such that the angles formed by the vectors $n_a$ normal to the gas liquid interface and on contact lines and vectors $n_b$ normal to analysis surfaces A will become a constant contact angle $\theta_c$ regardless of the position on the contact line, at each point in time during simulations. The vectors normal to the gas liquid interface refer to unit vectors perpendicular to the surfaces of droplets which are oriented toward gas (FIG. 5). The vectors normal to the analysis surface refer to unit vectors perpendicular to the analysis surface which are oriented either toward liquid or toward gas (FIG. 5).

Figure 6:
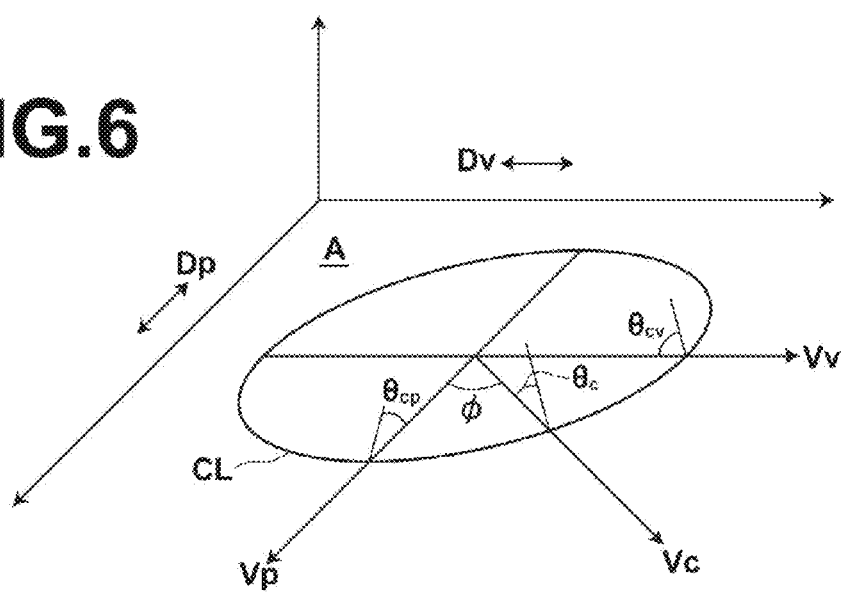
FIG. 6 is a conceptual diagram that illustrates the relationship between a contact angle $\theta_{cp}$ and a contact angle $\theta_{cv}$ obtained from a wetting property database and contact angles $\theta_c$ at positions along a contact line.

However, the present invention sets contact angles based on relationships between the directions of vectors normal to the contact line and the axis direction Dp of the pattern, to take anisotropy in wet spreading of droplets due to the pattern 1 of protrusions and recesses that defines the patterned surface P in behavior analysis of the contact line. Specifically, the contact angle $\theta_{cp}$ and the contact angle $\theta_{cv}$, which can be obtained from the wetting property database, are employed to obtain contact angles $\theta_c$ at each position along the contact line CL by Formula (1) below, as illustrated in FIG. 6. Note that in FIG. 6, Vp represents a vector normal to the contact line CL, which is parallel to the axis direction Dp of the pattern, and Vv represents a vector normal to the contact line CL, which is perpendicular to the axis direction Dp of the pattern.

$$\theta_c = \theta_{cp}\cdot|\cos\phi| + \theta_{cv}\cdot|\sin\phi| \tag{1}$$

Wherein φ represents angles formed by the directions of vectors Vc normal to the contact line CL and the axis direction Dp of the pattern at positions along the contact line.

Gas liquid two phase flow analysis in which the obtained wetting property parameters are incorporated is executed, by correcting the vectors $n_a$ normal to the gas liquid interface such that the angle formed by the vectors $n_a$ normal to the gas liquid interface and the vectors $n_b$ normal to the analysis surface at each position on the contact line CL become the contact angle $\theta_c$.

(Sixth Step)

The sixth step outputs the analysis results obtained in the fifth step as a height distribution of a unified film formed by the plurality of droplets. It becomes possible to predict the wet spreading and unions of a plurality of droplets by referring to this height distribution.

Simulation Method, Simulation Program, and Computer Readable Recording Medium Having the Simulation Program Recorded Therein Second Embodiment Next, a simulation method, etc. according to a second embodiment of the present invention will be described. The second embodiment differs from the first embodiment in that the simulation method further comprises a seventh step, and analysis is performed to optimize the arrangement of a plurality of droplets. Accordingly, descriptions of constituent elements which are the same as those of the first embodiment will be omitted insofar as they are not particularly necessary.

Figure 7:
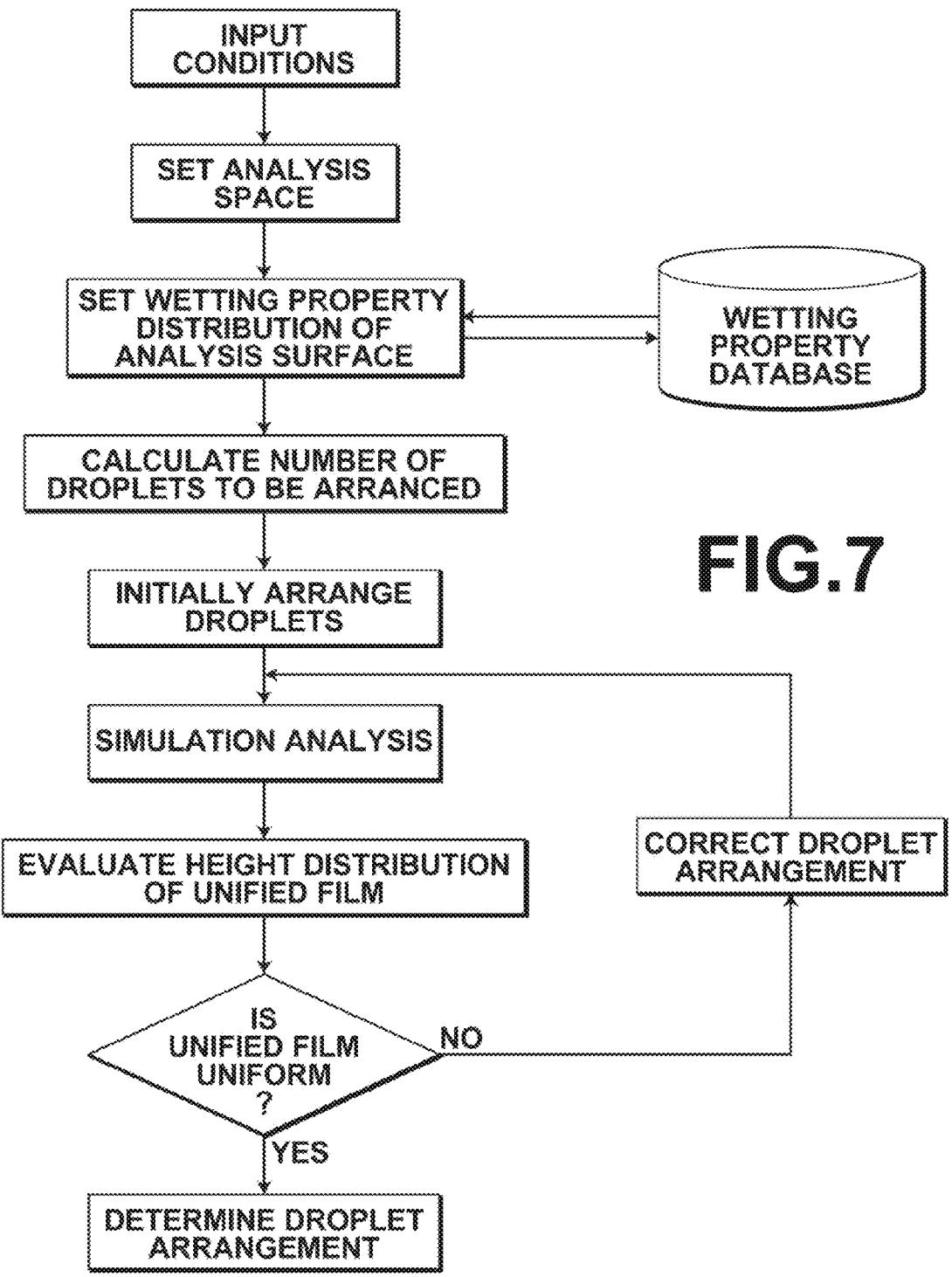
FIG. 7 is a block diagram that illustrates the procedures for obtaining an optimized droplet arrangement.

FIG. 7 is a block diagram that illustrates the steps of the simulation method of the second embodiment.

The simulation method of the second embodiment is a simulation method for predicting wet spreading and unions of a plurality of droplets arranged on the patterned surface P defined by a fine pattern 1 of protrusions and recesses, the patterned surface P causing anisotropy to occur in the wet spreading of the droplets. The format of the pattern 1 of protrusions and recesses that defines the patterned surface P, which is the target of analysis, and the density, the viscosity coefficient and the surface tension of the material of the droplets to be arranged on the patterned surface P are obtained as necessary parameters. The contact angle of the droplets with respect to a planar surface formed by the material of the pattern 1 of protrusions and recesses, or a combination of an interface tension between the material of the droplets and the material of the pattern 1 of protrusions and recesses and the surface tension of the material of the pattern 1 of protrusions and recesses is obtained as an optional parameter. Thereafter, the simulation method executes: a first step that sets an axis direction Dp of the pattern according to the shape of the pattern 1 of protrusions and recesses that defines the patterned surface P on the modeled analysis surface A of the patterned surface P, which is the target of analysis; a second step that arranges a number $n_{init}$ of droplets, which is less than or equal to a maximum number $n_{drop}$ determined by Formula (2) below, as the plurality of droplets; a third step that refers to a wetting property database that has stored therein wetting property parameters that indicate wetting properties for a plurality of reference patterned surfaces that include the wetting property parameters corresponding to formats of patterns of protrusions and recesses that define the plurality of patterned surfaces; a fourth step that obtains wetting property parameters that correspond to the format of the pattern 1 of protrusions and recesses that defines the patterned surface P, which is the target of analysis, based on the wetting property database; a fifth step that treats the influence imparted by the pattern 1 of protrusions and recesses that defines the patterned surface P, which is the target of analysis, on the wet spreading of droplets as wetting properties of the analysis surface A, and analyzes the wet spreading and unions of the plurality of droplets on the analysis surface A by gas liquid two phase flow analysis that incorporates the obtained wetting property parameters; a sixth step that outputs the analysis results obtained in the fifth step as a height distribution of a unified film formed by the plurality of droplets; and a seventh step that adjusts the arrangement of the plurality of droplets on the analysis surface and/or increases the number of the plurality of droplets within a range that does not exceed the maximum number $n_{drop}$ in the case that there are portions having heights that do not match a predetermined threshold height, in the height distribution obtained in the sixth step. In the simulation method of the second embodiment, the fifth step through the seventh step are repeatedly executed with respect to the plurality of droplets, the arrangement of which has been adjusted and/or the number of which has been increased, until there are no portions in the height distribution that have heights that do not match the predetermined threshold height, to optimize the arrangement of the plurality of droplets.

$$n_{drop} = \text{int}\left(\frac{V_{film}}{V_{drop}}\right) \quad (2)$$

wherein $V_{film}$ represents a desired volume of the unified film to be formed on the analysis surface A, $V_{drop}$ represents the volume of each droplet, and int represents that digits below the decimal point are cut off from the numerical value within the parentheses.

The simulation program and the computer readable recording medium having the simulation program recorded therein of the second embodiment cause a computer to execute the simulation program described above.

There may be cases in which the volume of a unified film to be formed on the pattern 1 of protrusions and recesses is determined in advance, when predicting the wet spreading and unions of a plurality of droplets. In such cases, the number of droplets to be arranged on the patterned surface P is determined by the relationship between the predetermined volume and the droplet expelling amount of a droplet arranging means (an ink jet head, for example). Therefore, the simulation method of the second embodiment optimizes the arrangement of $n_{drop}$ droplets, which is determined by Formula (2) based on the desired volume of the unified film and the volume of each droplet which is expelled. Thereby, it becomes possible to predict a droplet arrangement that minimizes regions that will become defective due to residual gas, that is, regions at which the gas phase and the analysis surface A contact each other, when the unified film is formed.

Figure 8:
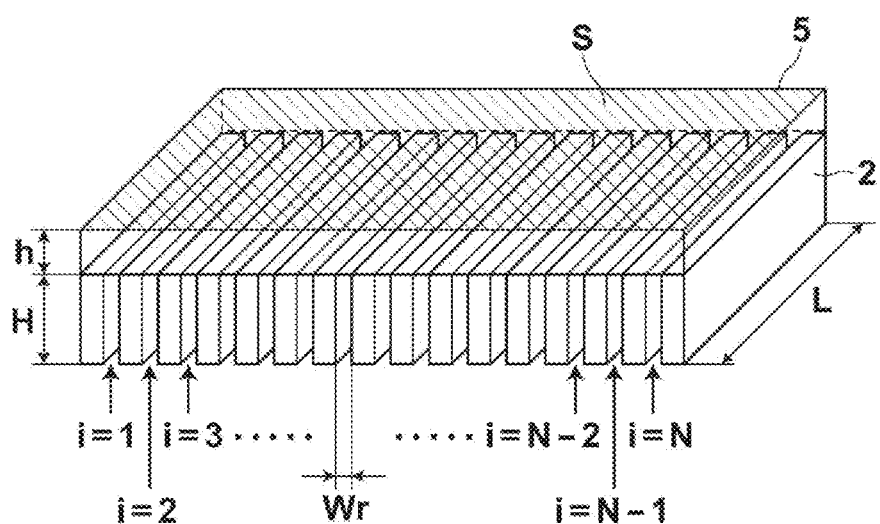
FIG. 8 is a schematic diagram for explaining the volume of the entirety of a liquid phase, which is necessary in analysis.

For example, a case will be considered in which nanoimprinting using the ink jet method is executed using a mold having a fine pattern of protrusions and recesses formed on a surface thereof to form a resist film onto which a pattern is transferred, as illustrated in FIG. 8. The widths, depths, lengths, and number of recesses of the pattern of protrusions and recesses of the mold, which is a target of analysis, are designated as Wr, H, L, and N, respectively. The area of the analysis surface A is designated as S, and the height of the resist film from the analysis surface A after curing (corresponding to the thickness of so called residual film in nanoimprinting) is designated as h. The desired volume $V_{film}$ of a film 5 of unified droplets (that is, the resist film prior to curing) can be obtained by Formula (10) below.

$$V_{film} = \frac{1}{\alpha}\left(\sum_{i=1}^{N} W_i \cdot H_i \cdot L_i + S \cdot h\right) \quad (10)$$

wherein $\alpha$ represents the contraction rate of the resist film accompanying curing thereof.

In the case that a droplet arrangement that can minimize defects due to residual gas is predicted by simulation analysis, corrections from an initial arrangement of droplets becomes important. The corrections from the initial arrangement of droplets are realized by the seventh step of the second embodiment.

(Second Step)

In the second step of the present embodiment, a number $n_{init}$ of modeled droplets, which is less than or equal to a maximum number $n_{drop}$ determined by Formula (2), is initially arranged on the analysis surface A. The number $n_{init}$ of the initially arranged droplets may be less than the maximum number $n_{drop}$, in order to maintain droplets to be arranged at regions at which there are not enough droplets after the initial arrangement. The arrangement of the droplets is not particularly limited at the initial arrangement step, and the droplets may be arranged equally in drop sites on the analysis surface A, for example.

(Seventh Step)

The seventh step adjusts the arrangement of the plurality of droplets on the analysis surface and/or increases the number of the plurality of droplets within a range that does not exceed the maximum number $n_{drop}$ in the case that there are portions having heights that do not match a predetermined threshold height, in the height distribution obtained in the sixth step. The predetermined threshold height is a height of the desired film of unified droplets from the analysis surface. The expression "heights that do not match a predetermined threshold height" refers to the heights of the portions substantially not matching the predetermined threshold height from the viewpoint of accuracy of analysis. The range of substantial matching depends on the required degree of analysis accuracy, but it is preferable for the range to be ±10% the predetermined threshold height.

After the initial arrangement is determined in the second step, the third through sixth steps are executed, and a simulation of wet spreading and unions of the droplets is executed by gas liquid two phase flow analysis. The height distribution of the unified film within the analysis space is obtained from the results of analysis by simulation, and the heights of the gas liquid interface and defects due to residual gas at positions in the unified film can be estimated from the height distribution.

In order to form a desired uniform unified film, it is necessary to adjust the arrangement of the plurality of droplets and to increase the number of the droplets to eliminate gradients (corresponding to fluctuations in film thickness) and defects due to residual gas.

Figure 9:
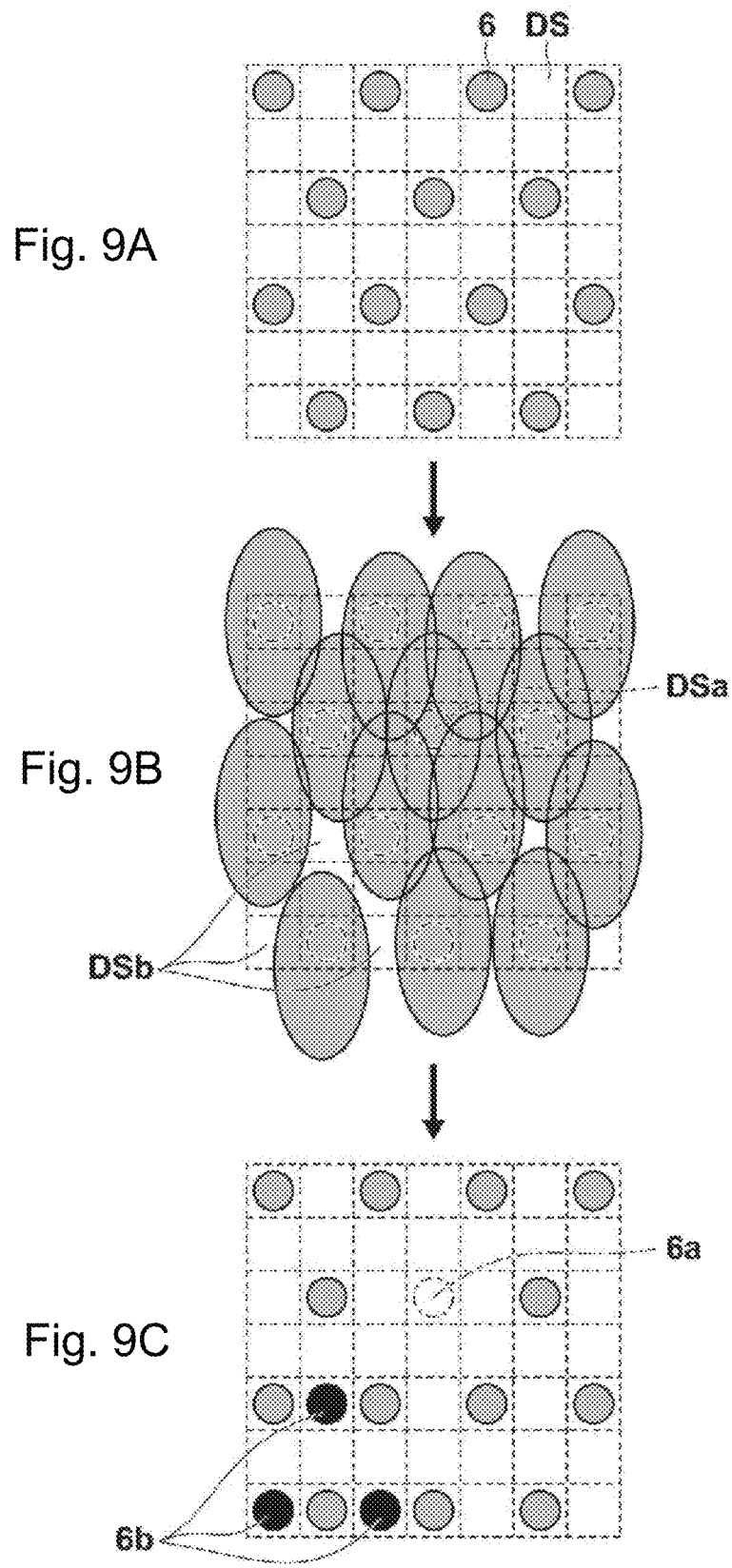
FIGS. 9A-9C are a collection of schematic diagrams that illustrate the manner in which a droplet arrangement is corrected based on a height distribution of a unified film obtained by analysis.

Correction of the droplet arrangement is executed as illustrated in FIG. 9. First, $n_{init}$ droplets are initially arranged in the second step (A of FIG. 9). Then, the third through sixth steps are executed, and analysis is executed until a desired filling time passes or the interface distribution assumes a quasi stable state (B of FIG. 9). At this time, regions at which the height on the analysis surface A is greater than the predetermined threshold height and regions at which the height on the analysis surface A is less than the predetermined threshold height are detected, based on the height distribution obtained in the sixth step. Regions at which the height is greater than the predetermined threshold height represent that the droplets are excessive, and regions at which the height is less than the predetermined threshold height represent that there are insufficient droplets. Accordingly, droplets 6a which are arranged at drop sites DSa in the vicinity of regions at which the height is greater than the predetermined threshold height are moved or removed to adjust the arrangement of the plurality of droplets (C of FIG. 9). Meanwhile, droplets 6b are added to drop sites DSb in the vicinity of regions at which the height is less than the predetermined threshold height to increase the number of the plurality of droplets (C of FIG. 9).

With respect to regions at which the height is greater than the predetermined threshold height, it is preferable for the droplets 6a to be moved or removed according to the slope of the gas liquid interface. For example, if the slope of the gas liquid interface is greater than a threshold value, a droplet is moved to an adjacent drop site in the interface slope vector direction (a direction toward a local minimum of the interface height). In the case that the slope is less than the threshold value (in the vicinity of a local maximum) or a droplet is already arranged in the destination drop site, the droplet is removed from the drop site.

With respect to regions at which the height is less than the predetermined threshold height, it is preferable for the number of droplets to be increased until the total number of droplets reaches the maximum number $n_{drop}$ in order from regions at which the defects due to residual gas is greatest.
(Optimization of Droplet Arrangement)

The fifth through seventh steps are repeatedly executed with respect to the plurality of droplets, the arrangement of which has been adjusted and/or the number of which has been increased, until there are no portions in the height distribution that have heights that do not match the predetermined threshold height, to optimize the arrangement of the plurality of droplets. At the step when there are no portions in the height distribution that have heights that do not match the predetermined threshold height, the number of droplets will be the maximum number $n_{drop}$. The arrangement of the plurality of droplets obtained as the analysis results by the last fifth step which is executed is the optimized droplet arrangement obtained by the analysis.
(Droplet Arrangement Pattern)

The first step through the seventh step are executed as many times as necessary as described above. A droplet arrangement pattern is produced, based on the optimized arrangement of the plurality of droplets obtained as analysis results by the last fifth step which is executed. The droplet arrangement pattern is utilized as a reference when droplets are arranged by an ink jet apparatus or the like.
[Nanoimprinting Method, Method for Producing Patterned Substrates, and Ink Jet Apparatus]

Hereinafter, embodiments of a nanoimprinting method, a method for producing patterned substrates, and an ink jet apparatus that utilize the simulation method of the present invention will be described.

The nanoimprinting method of the present embodiment is characterized by comprising the steps of: arranging a plurality of droplets of a curable resin according to a droplet arrangement pattern produced by the simulation method described above onto a surface to be processed of a processing target substrate by the ink jet method; pressing a mold having a patterned surface, which is a target of analysis, against the plurality of droplets arranged on the surface to be processed while the patterned surface and the surface to be processed face each other, to form a curable resin film on the surface to be processed; curing the curable resin film; and separating the mold from the cured resin film.

The method for producing a patterned substrate of the present embodiment is characterized by comprising the steps of: forming a resist film constituted by cured resin, on which a pattern of protrusions and recesses of a mold is transferred by the nanoimprinting method described above, onto a substrate to be processed; and performing dry etching using the resist film as a mask to form a pattern of protrusions and recesses corresponding to the pattern of protrusions and recesses transferred to the resist film on the substrate to be processed, to obtain a patterned substrate.

An ink jet apparatus 10 of the present invention is characterized by comprising: a computer readable recording medium having recorded therein a simulation program that causes a computer to execute the simulation method described above, as illustrated in FIG. 10 through FIG. 12.
(Mold)

The mold to be utilized in the present embodiment may be produced by the following procedures, for example. First, a Si substrate is coated with a photoresist liquid having acrylic resin as its main component such as a novolac resin or an acrylic resin such as PMMA (polymethyl methacrylate) by the spin coat method or the like, to form a photoresist layer. Next, a laser beam (or an electron beam) is irradiated onto the Si substrate while being modulated according to a desired pattern of protrusions and recesses, to expose the pattern on the surface of the photoresist layer. Then, the photoresist layer is developed to remove the exposed portions. Finally, selective etching is performed by RIE or the like, using the photoresist layer after the exposed portions are removed as a mask, to obtain the Si mold having a predetermined pattern of protrusions and recesses.

The mold to be utilized in the imprinting method of the present invention may undergo a mold release process to improve separation properties between the resist and the mold. A silicone or fluorine silane coupling agent may be favorably utilized as a mold release agent in the mold release process. Commercially available mold release agents such as Optool DSX by Daikin Industries K.K. and Novec EGC-1720 by Sumitomo 3M K.K. may be favorably employed. Meanwhile, the present embodiment will be described as a case in which a Si mold is employed. However, the mold is not limited to the Si mold, and it is also possible to employ a quartz mold. In this case, the quartz mold may be produced by the same method as that for producing the Si mold described above, or may be produced by a method for processing a substrate to be described later.

(Resist)

The resist is not particularly limited. In the present embodiment, a resist prepared by adding a photopolymerization initiator (2% by mass) and a fluorine monomer (0.1% by mass to 1% by mass) to a polymerizable compound may be employed.

An antioxidant agent (approximately 1% by mass) may further be added as necessary. The resist produced by the above procedures can be cured by ultraviolet light having a wavelength of 360 nm. With respect to resist having poor solubility, it is preferable to add a small amount of acetone or acetic ether to dissolve the resin, and then to remove the solvent.

Examples of the polymerizable compound include: benzyl acrylate (Viscoat #160 by Osaka Organic Chemical Industries, K.K.), ethyl carbitol acrylate (Viscoat #190 by Osaka Organic Chemical Industries, K.K.), polypropylene glycol diacrylate (Aronix M-220 by TOAGOSEI K.K.), and trimethylol propane PO denatured triacrylate (Aronix M-310 by TOAGOSEI K.K.). In addition, a compound represented by the Chemical Formula 1 below may also be employed as the polymerizable compound.

[Chemical Formula 1]

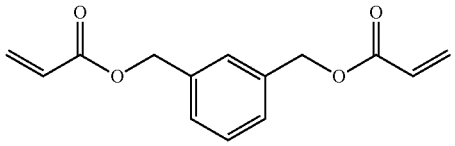

Examples of the photopolymerization initiating agent include alkyl phenone type photopolymerization initiating agents, such as 2-(dimethyl amino)-2-[(4-methylphenyl)methyl]-1-[4-(4-morpholinyl)phenyl]-1-butanone (IRGACURE 379 by Toyotsu Chemiplas K.K.)

In addition, a compound represented by Chemical Formula 2 below may be employed as the fluorine monomer.

[Chemical Formula 2]

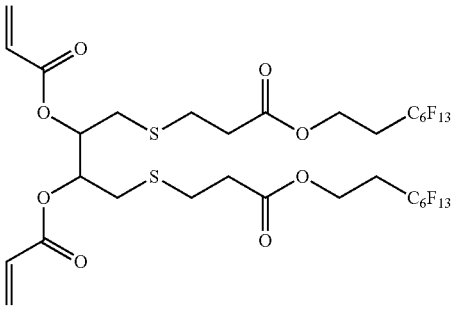

In the present invention, the viscosity of the resist material is within a range from 8 cP to 20 cP, and the surface energy of the resist material is within a range from 25 mN/m to 35 mN/m. Here, the viscosity of the resist material was measured by a RE-80L rotating viscosity meter (by Touki Industries K.K.) at 25±0.2° C. The rotating speeds during measurements were: 100 rpm at viscosities greater than or equal to 0.5 cP and less than 5 cP; 50 rpm at viscosities greater than or equal to 5 cP and less than 10 cP; 20 rpm at viscosities greater than or equal to 10 cP and less than 30 cP; and 10 rpm at viscosities greater than or equal to 30 cP and less than 60 cP. The surface energy of the resist material was measured using the technique disclosed in H. Schmitt et al., "UV nanoimprint materials: Surface energies, residual layers, and imprint quality", J. Vac. Sci. Technol. B., Vol. 25, Issue 3, pp. 785-790, 2007. Specifically, the surface energies of Si substrates that underwent UV ozone processes and the surface of which were treated with Optool DSX (by Daikin Industries K.K.) were measured, then the surface energy of the resist material was calculated from the contact angles thereof with respect to the substrates.

(Substrate to be Processed)

A quartz substrate is preferred to enable the resist to be exposed to light in the case that a Si mold, which is not light transmissive, is employed. The quartz substrate is not particularly limited as long as it has light transmissive properties and has a thickness of 0.3 mm or greater, and may be selected as appropriate according to intended use. A quartz substrate having a surface coated with a silane coupling agent may be employed. Further, a quartz substrate having a mask layer with a laminated structure including at least one layer on the surface thereof may be utilized. Preferred examples of the material of the mask layer are: metals, such as chrome, tungsten, tantalum, titanium, nickel, silver, platinum, and gold; oxides of these metals; and nitrides of these metals. Further, it is preferable for the mask layer to have at least one layer that contains a chrome oxide or a chrome nitride. It is preferable for the thickness of the mask layer to be 30 nm or less, and more preferably 20 nm or less. If the thickness of the mask layer exceeds 30 nm, UV transmissivity deteriorates, and resist curing failures become more likely to occur. Note that the surface of the mask layer may be coated with a silane coupling agent.

The expression "light transmissive properties" refers to a degree of light transmissivity that enables sufficient curing of the resin film when light enters the side of the substrate opposite that on which the resin film is formed. Specifically, the "light transmissive properties" refers to light transmissivity of 5% or greater with respect to light having wavelengths of 200 nm or greater from the side of the substrate opposite that on which the resin film is formed to the side of the substrate on which the resin film is formed.

It is preferable for the thickness of the quartz substrate to be 0.3 mm or greater. If the thickness of the quartz substrate is less than 0.3 mm, it is likely to become damaged during handling or due to pressure during imprinting.

Meanwhile, substrates to be processed which are employed with the quartz mold are not limited with regard to the shape, the structure, the size or the material thereof, and may be selected according to intended use. With respect to the shape of the substrate, a substrate having a discoid shape may be utilized in the case that a data recording medium is to be produced. With respect to the structure of the substrate, a single layer substrate may be employed, or a laminated substrate may be employed. With respect to the material of the substrate, the material may be selected from among known materials for substrates, such as silicon, nickel, aluminum, glass, and resin. These materials may be utilized singly or in combination. The substrate may be produced, or may be those which are commercially available. The thickness of the substrate is not particularly limited, and may be selected according to intended use. However, it is preferable for the thickness of the substrate to be 0.05 mm or greater, and more preferably 0.1 mm or greater. If the thickness of the substrate is less than 0.05 mm, there is a possibility that the substrate will flex during close contact with the mold, resulting in a uniform close contact state not being secured.

(Method for Arranging Droplets of Resist)

The droplets are arranged by coating predetermined positions of the substrate to be processed with droplets having predetermined droplet amounts (an amount per each single arranged droplet) utilizing the ink jet method or the dispensing method.

When the droplets of the resist are arranged on the substrate to be processed, an ink jet printer or a dispenser may be used according to the desired droplet amounts. For example, in the case that the droplet amount is less than 100 nl, the ink jet printer may be selected, and in the case that the droplet amount is 100 nl or greater, the dispenser may be selected.

Examples of ink jet heads that expel the resist from nozzles include the piezoelectric type, the thermal type, and the electrostatic type. From among these, the piezoelectric type of ink jet head, in which the droplet amount (the amount of each arranged droplet) and the expelling speed are adjustable, is preferable. The amount of droplet amount and the expelling speed are set and adjusted prior to arranging the droplets of the resist onto the substrate to be processed. For example, it is preferable for the droplet amount to be adjusted to be greater at regions at which the spatial volume of the pattern of protrusions and recesses of the mold is large, and to be smaller at regions at which the spatial volume of the pattern of protrusions and recesses of the mold is small. Such adjustments are controlled as appropriate according to droplet expulsion amounts (the amount of each expelled droplet). Specifically, in the case that the droplet amount is set to 5 pl, an ink jet head having a droplet expulsion amount of 1 pl is controlled to expel droplets onto the same location 5 times. In the present invention, the droplet amount is within a range from 1 pl to 10 pl. The droplet amount is obtained by measuring the three dimensional shapes of droplets arranged on a substrate under the same conditions with a confocal microscope or the like, and by calculating the volumes of the droplets from the shapes thereof.

After the droplet amount is adjusted in the manner described above, the droplets are arranged on the substrate to be processed according to a predetermined droplet arrangement pattern. The droplet arrangement pattern is produced based on the simulation method of the present invention.

(Contact Step Between Mold and Resist)

The mold is pressed against the substrate to be processed after depressurizing the atmosphere between the mold and the substrate, or after causing the atmosphere between the mold and the substrate to be a vacuum. However, there is a possibility that the resist will volatilize before curing in a vacuum environment, causing difficulties in maintaining a uniform film thickness. Therefore, it is preferable to reduce the amount of residual gas by causing the atmosphere between the substrate and the mold to be a He atmosphere or a depressurized He atmosphere. He passes through the quartz substrate, and therefore the amount of residual gas (He) will gradually decrease. As the passage of He through the quartz substrate takes time, it is more preferable for the depressurized He atmosphere to be employed. It is preferable for the pressure of the depressurized He atmosphere to be within a range from 1 kPa to 90 kPa, and more preferably a range from 1 kPa to 10 kPa.

The mold and the substrate to be processed, which is coated with the resist, are caused to contact each other after they are positioned to have a predetermined positional relationship. It is preferable for alignment marks to be employed to perform the positioning operation. The alignment marks are formed by patterns of protrusions and recesses which can be detected by an optical microscope or by the Moire interference technique. The positioning accuracy is preferably 10 μm or less, more preferably 1 μm or less, and most preferably 100 nm or less.

(Mold Pressing Step)

The mold is pressed against the substrate at a pressure within a range from 100 kPa to 10 MPa. The flow of the resist is promoted, the residual gas is compressed, the residual gas dissolves into the resist, and the passage of He through the quartz substrate is promoted as the pressure is greater. However, if the pressure is excessive, there is a possibility that the mold and the substrate will be damaged if a foreign object is interposed between the mold and the substrate when the mold contacts the substrate. Accordingly, it is preferable for the pressure to be within a range from 100 kPa to 10 MPa, more preferably within a range from 100 kPa to 5 MPa, and most preferably within a range from 100 kPa to 1 MPa. The reason why the lower limit of the pressure is set to 100 kPa is that in the case that the space between the mold and the substrate is filled with liquid when performing imprinting within the atmosphere, the space between the mold and the substrate is pressurized by atmospheric pressure (approximately 101 kPa).

(Mold Release Step)

After the mold is pressed against the substrate and the resist film is formed, the mold is separated from the resist film. As an example of a separating method, the outer edge portion of one of the mold and the substrate to be processed may be held, while the rear surface of the other of the mold and the substrate to be processed is held by vacuum suction, and the held portion of the outer edge or the held portion of the rear surface is relatively moved in a direction opposite the pressing direction.

(Ink Jet Apparatus)

Figure 10:
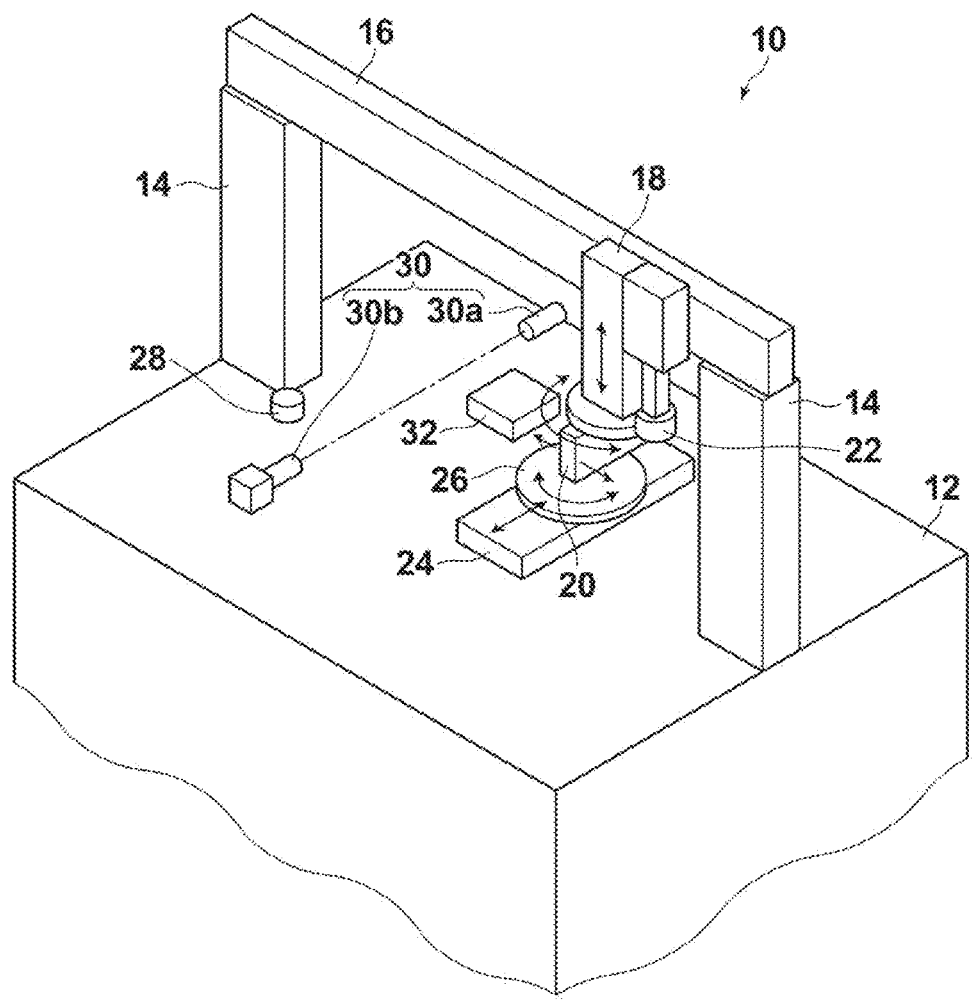
FIG. 10 is a schematic diagram that illustrates an ink jet apparatus according to an embodiment of the present invention.

FIG. 10 is a schematic diagram that illustrates an ink jet coating apparatus that employs the ink jet method to discretely arrange resist as a resist arranging apparatus.

As illustrated in FIG. 10, the ink jet coating apparatus 10 of the present embodiment has a configuration that includes: a support base 12; two support columns 14 erected perpendicular to the support base 12; a beam 16 that spans between the two support columns 14; a head holding/moving means 18 that moves along the beam 16; an ink jet head 20 mounted on the lower end of the head holding/moving means 18 via a rotatable stage; a work aligning means 22 which is also mounted on the head holding/moving means 18; a work holding/moving means 24, on which substrates for semiconductors, etc. are placed as work 26, provided on the support base 12; a nozzle surface observing means 28 for observing the nozzle surface of the ink jet head 20; an expulsion state observing means 30 (30a and 30b); and a maintenance means 32 for maintaining the nozzle surface of the ink jet head 20.

The head holding/moving means 18 is equipped with: a moving means for holding the ink jet head 20 at the end portion thereof and moving the ink jet head 20 in a direction along the beam 16; the rotatable stage that rotates the ink jet head 20 with the direction in which ink is expelled therefrom as the center of rotation; and moving means for moving the ink jet head in the ink expelling direction (the vertical direction in the coordinate system of FIG. 10). By moving the ink jet head 20 in the ink expelling direction, the flight distance of resist expelled from the ink jet head 20 to a landing point on the work 26 can be adjusted. In addition, it is possible to adjust the intervals of landing points on the work 26 at which the resist lands, by moving the ink jet head 20 in the direction along the beam 16 and by rotating the ink jet head 20.

A linear motor is a favorable example of the moving means that moves the ink jet head linearly in the direction along the beam 16 and in the ink expelling direction. Linear encoders are also provided as position detecting means to enable accurate movement control. A stepping motor or the like may be employed as a rotating means. An encoder is also provided as a position detecting means for the rotating means.

The ink jet head 20 expels resist from nozzles. The driving method of the ink jet head 20 is not particularly limited, and various methods, such as the piezoelectric type, the thermal type, and the electrostatic type may be employed. In the case of the present embodiment that expels resist for nanoimprinting, the piezoelectric method, in which the droplet amount and the expelling speed of resist are adjustable, is preferable. Therefore, the present embodiment employs the piezoelectric method. The expelling speed, the expelled volume, and the positions of landing points on the work 26 are adjusted by adjusting drive waveforms (voltage waveforms) for driving piezoelectric actuators (piezoelectric elements), as will be described in detail later.

A resist supply system that supplies resist to the ink jet head 20 will also be described later.

The work aligning means 22 detects the position of the work 26 (substrate 26) to perform positional adjustments thereto. The work aligning means 22 is equipped with an alignment camera that detects the alignment of the work 26 and a landing position detecting camera that detects the landing positions of resist which is caused to land on a piece of dummy work for positional detection.

The work holding/moving means 24 suctions, holds, and moves the work 26, and is equipped with means for suctioning the work 26. The suctioning method employed by the suctioning means is not limited, and may be vacuum suction, electrostatic suction, etc. In addition, the work holding/moving means 24 is equipped with: a moving means such as linear motors that hold and move the work 26 in a first direction and a second direction perpendicular to the first direction (x and y directions); and linear encoders as position detecting means. Further, the work holding/moving means 24 is equipped with a rotating means such as a stepping motor capable of holding and rotating the work 26 with a work normal line parallel to the ink expelling direction of the ink jet head 20 as the center of rotation, and an encoder for detecting the rotational position of the rotating means.

The nozzle surface observing means 28 is utilized to observe the nozzle surface of the ink jet head 20 to judge whether maintenance is necessary, to judge whether a the head should be replaced, etc. The nozzle surface observing means 28 is equipped with a light source, a lens, and a camera for observing the state of the nozzles. In the case that the nozzle surface is to be observed, the head holding/moving means 18 moves the ink jet head 20 to a position directly above the nozzle surface observing means 28.

The expulsion state observing means 30 (30a and 30b) observe the state of flight of resist, which is expelled from the nozzles of the ink jet head 20. The expulsion state observing means 30 is equipped with a light source, a lens, and a camera for observing the state of flight.

That is, the expulsion state observing means 30 receives detecting light emitted by a light emitting means (light source) 30a with a light receiving means (camera) 30b, observes the expulsion state by detecting changes in the light by resist that flies through the detecting light, and measures the ink expelling speed. In the case that the expulsion state is to be observed, the expulsion state observing means 30 or the ink jet head 20 is moved such that resist will fly through the detecting light.

The maintenance means 32 maintains the ink jet head 20 in a favorable state. To this end, the maintenance means 32 is equipped with wipers for cleaning resist, etc., which is adhered to the nozzle surface, a cap for preventing resist inside the nozzles from drying, etc. The cap may also be utilized when removing foreign matter such as bubbles from the interior of the ink jet head 20 by suctioning resist through the nozzles.

Figure 11:
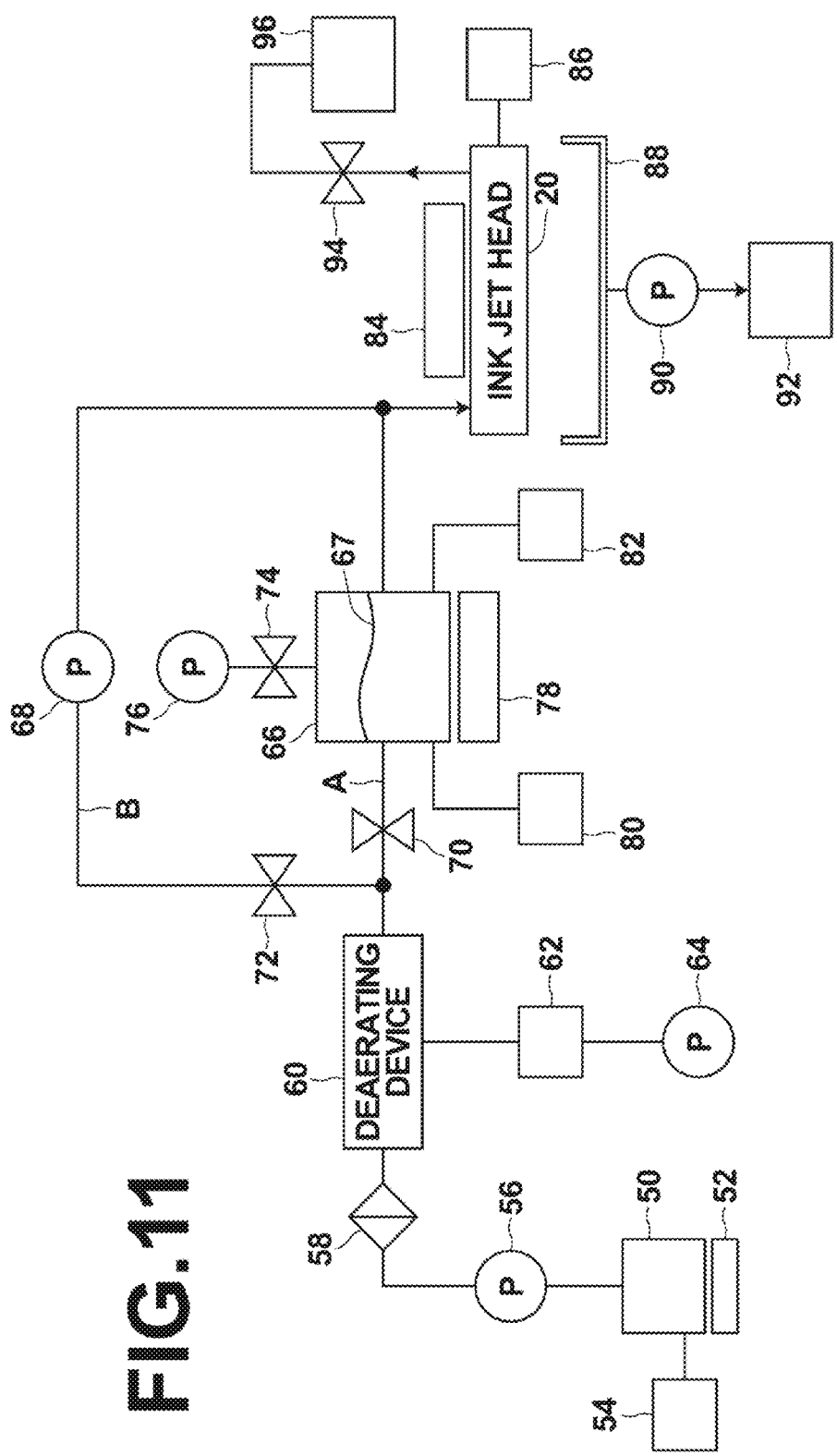
FIG. 11 is a schematic diagram that illustrates the configuration of a resist supply system of the ink jet apparatus of FIG. 10.

FIG. 11 is a schematic diagram that illustrates the configuration of the resist supply system.

As illustrated in FIG. 11, the resist supply system of the present embodiment supplies resist from a resist supply tank 50 that stores resist to the ink jet head 20. Each component of the resist supply system is connected by pipe lines (tubes).

The resist supply tank 50 is a tank for supplying resist to the ink jet head, and is provided with a heating/cooling means 52 (temperature adjusting means 52) and a temperature sensor 54. In addition, a pump 56 for pumping resist and sending it to the ink jet head is provided downstream from the resist supply tank 50.

A filter 58 that removes polymers (impurities) and a deaerating device that removes bubbles and dissolved gas are provided along the pipe line that connects the resist supply tank 50 and the ink jet head 20. The filter 58 is not particularly limited, and an ultra high molecular weight polyethylene (UPE) membrane or a nylon membrane may be utilized. It is preferable for the filter mesh size of the filter 58 to be the same as or less than the nozzle diameter of the ink jet head 20. In addition, a liquid trap section 62 and a pump 64 are connected to the deaerating device 60.

A sub tank 66 is provided along a pipe line A that connects the deaerating device 60 and the ink jet head 20, and another pipe line B is provided that bypasses the sub tank 66. A pump 68 is provided along the pipe line B. A valve 70 and a valve 72 are provided in the pipe line A and the pipe line B, respectively, to enable switching between the pipe line A and the pipe line B by controlling opening and closing operations of the valve 70 and the valve 72. During normal drawing, the valve 70 is opened while the valve 72 is closed to supply resist through the pipe line A, and the valve 70 is closed while the valve 72 is opened during initial filling or purging through the pipe line B.

A membrane 67 is provided in the sub tank 66. Air is supplied and suctioned to and from a space above the membrane 67 with a pump 76, to control the pressure of the space above the membrane 67, thereby controlling the pressure of the resist under the membrane 67. Thereby, the meniscus pressure of resist inside the nozzles can be adjusted. In addition, the sub tank 66 is equipped with a pressure sensor 80 for detecting the pressure of the resist.

The sub tank 66 having the membrane 67 and provided with the pump 76 via the valve 74 functions as a meniscus pressure adjusting means for adjusting the meniscus pressure of resist inside the nozzles.

Further, the sub tank 66 is provided with a heating/cooling means 78 (temperature adjusting means 78) and a temperature sensor 82. The resist supply tank 50 and the sub tank 66 are configured to be capable of independently controlling the temperature of the resist therein.

In addition, the ink jet head 20 is provided with a heating/cooling means 84 (temperature adjusting means 84) and a temperature sensor 86. The temperature of the resist can also be controlled at the ink jet head 20.

A cap 88 of the maintenance means 32 is provided as a means for preventing drying of the nozzles or to prevent increases in the viscosity of resist in the vicinity of the nozzles. The cap 88 is moved from a predetermined standby position to a maintenance position under the ink jet head 20 as necessary.

The cap 88 is configured to be able to cover the nozzle surface of the ink jet head 20. Although omitted from the drawings, the maintenance means 32 also has a cleaning blade for wiping and cleaning the nozzle surface.

In the case that the utilization frequency of a specific nozzle decreases during drawing or while standing by and the viscosity of resist in the vicinity of the nozzle increases, preliminary expulsion toward the cap 88 is performed in order to discharge the deteriorated resist, of which the viscosity has increased.

Resist cannot be discharged by preliminary expulsion when bubbles missed by the filter 58 and the deaerating device 60 are mixed within the nozzles, or when the increase in the viscosity of resist inside the nozzles exceeds a certain level. In such cases, the cap 88 is placed against the nozzle surface of the ink jet head 20, the resist within the ink jet head 20 is suctioned by a suctioning pump 90, and the resist removed by suction is routed to a recovery tank 92.

Alternatively, the valve 70 may be closed and the valve 72 maybe opened such that resist will flow through the pipe line B, then resist can be forced to the ink jet head 20 by driving the pump 68 to remove bubbles and the like by discharging (purging) resist from the nozzles.

However, such suctioning operations and purging operations are performed on all of the resist within the ink jet head 20, and therefore, the amount of consumed resist is great. Accordingly, it is preferable to perform preliminary expulsion in cases that the increase in viscosity is small. Note that the cap 88 functions as a suctioning means and as a resist receiver during preliminary expulsion. It is preferable for a configuration to be adopted in which the interior of the cap 88 is divided into a plurality of regions corresponding to columns of nozzles by partition walls, and each of the partitioned regions can be selectively suctioned.

FIG. 12 is a schematic diagram that illustrates the configuration of a control system of the ink jet apparatus.

The control system of the inkjet apparatus is equipped with: a communications interface 102; a system controller 104; an image memory 106; a print control section 108; a head driver 110; an image buffer memory 112; a resist supply control section 116; a maintenance control section 118; an observation control section 122; a load/unload control section 124; an alignment control section 126; a motor control section 130, etc.

The communications interface 102 is an interface section that receives droplet arrangement patterns and information regarding resist (physical property values such as viscosity and surface energy) which are sent by a host computer 100. A serial interface, such as USB, IEEE1394, Ethernet™, and a wireless network, or a parallel interface such as the Centronics interface may be employed as the communications interface 102. This section may be provided with a buffer memory in order to accelerate communications.

The droplet arrangement patterns and information regarding resist sent by the host computer 100 are received by the system controller 104 via the communications interface 102, and stored temporarily in the image memory 106. The image memory 106 is a memory means for temporarily storing droplet arrangement patterns and information regarding resist input via the communications interface 102, to which reading and writing of information is performed through the system controller 104. The image memory 106 is not limited to a memory constituted by semiconductor elements, and magnetic media such as a hard disk may be employed as the image memory 106.

The system controller 104 is a control section that controls components such as the communications interface 102, the image memory 106, the print control section 108, and the head driver 110. The system controller 104 is constituted by a CPU (Central Processing Unit), peripheral circuits thereof, etc. The system controller 104 not only controls communications with the host computer 100 and reading and writing operations with respect to the image memory 106, but also generates control signals for controlling control sections, such as the resist supply control section 116, the maintenance control section 118, the observation control section 122, the load/unload control section 124, the alignment control section 126, and the motor control section 130.

The print controlling section 108 is a control section that has signal processing functions that perform various processes and corrections to generate control signals (driving waveforms) for controlling printing (drawing) from the droplet arrangement patterns and the information regarding resist in the image memory 106, according to control by the system controller 104. The print control section 108 supplies the generated print control signals (driving waveforms) to the head driver 110.

The print control section 108 administers necessary signal processes, and the amount of expelled resist and expelling timings of the ink jet head are controlled based on the droplet arrangement pattern via the head driver 110. Thereby, desired droplet sizes and desired droplet arrangements of resist that land on the work 26 are realized.

The print control section 108 is equipped with the image buffer memory 112. Data such as the information regarding resist and parameters are temporarily stored in the image buffer memory 112 when the print control section 108 processes the information regarding resist. Note that in FIG. 12, the image buffer memory 112 is illustrated as being appended to the print control section 108. Alternatively, the image memory 106 may also function as the image buffer memory 112. Further the print control section 108 and the system controller 104 may be integrated and constituted by a single processor.

The head driver 110 drives the ink jet head 20 based on the driving waveforms provided by the print control section 108, to cause resist to be expelled from the ink jet head 20. The head driver 110 may include a feedback control system to maintain constant head driving conditions.

The resist supply control section 116 mainly drives each of the pumps of a resist supply section 114 (the resist supply system illustrated in FIG. 11) to transport resist from the supply tank 50 to the ink jet head 20.

The maintenance control section 118 controls the maintenance means 32. When maintenance is necessary the maintenance control section 118 performs maintenance operations, such as: causing the cap of the maintenance means 32 to face the nozzle surface of the ink jet head 20 to perform preliminary expulsion or purging; and contacting the cap with the nozzle surface to suction resist having high viscosity.

The observation control section 122 controls an observation section 120 that includes the nozzle surface observing means 28 and the expulsion state observing means 30 (30a and 30b). The load/unload control section 124 controls a load/unload section 48 (48a and 48b). The alignment control section 126 controls an alignment section 22 (the work aligning means 22) to administer positional adjustments to the work. The motor control section 130 controls a motor section 128 to drive the head holding/moving means 18, the work holding/moving means 24, etc.

(Method for Processing Substrates)

Next, an embodiment of a method for processing a substrate of the present invention will be described. The present embodiment will be described as a case in which a substrate is processed by the nanoimprinting method described above, employing a Si mold as an original plate.

First, a resist film, on which a pattern has been transferred by the first nanoimprinting method, is formed on a surface of a substrate. Then, dry etching is performed using the resist film having the transferred pattern as a mask, to form a pattern of protrusions and recesses corresponding to the pattern of protrusions and recesses of the resist film. Thereby, a substrate having a predetermined pattern is obtained.

In the case that the substrate is of a layered structure and includes a metal layer on the surface thereof, dry etching is performed using the resist film as a mask, to form a pattern of protrusions and recesses corresponding to the pattern of protrusions and recesses of the resist film in the metal layer. Thereafter, dry etching is further performed with the thin metal layer as an etching stop layer, to form a pattern of protrusions and recesses in the substrate. Thereby, a substrate having a predetermined pattern is obtained.

The dry etching method is not particularly limited as long as it is capable of forming a pattern of protrusions and recesses in the substrate, and may be selected according to intended use. Examples of dry etching methods that may be employed include: the ion milling method; the RIE (Reactive Ion Etching) method; the sputter etching method; etc. From among these methods, the ion milling method and the RIE method are particularly preferred.

The ion milling method is also referred to as ion beam etching. In the ion milling method, an inert gas such as Ar is introduced into an ion source, to generate ions. The generated ions are accelerated through a grid and caused to collide with a sample substrate to perform etching. Examples of ion sources include: Kauffman type ion sources; high frequency ion sources; electron bombardment ion sources; duoplasmatron ion sources; Freeman ion sources; and ECR (Electron Cyclotron Resonance) ion sources.

Ar gas may be employed as a processing gas during ion beam etching. Fluorine series gases or chlorine series gases may be employed as etchants during RIE.

As described above, the method for producing a substrate of the present invention performs dry etching, using the resist film onto which a pattern is transferred by the nanoimprinting method described above as a mask. That is, a mask free of fluctuations in the thickness of residual film and also free from defects due to residual gas is employed to perform dry etching. Therefore, it becomes possible to produce substrates highly accurately at high yield.

EXAMPLES

An example of the present invention will be described hereinafter.
(Production of Mold)

First, a Si substrate was coated with a photoresist liquid having PMMA (polymethyl methacrylate) as a main component by the spin coat method, to form a photoresist layer. Thereafter, an electron beam, which was modulated according to line pattern having a line width of 60 nm and a pitch of 120 nm, was irradiated onto the photoresist layer while the Si substrate was scanned on an XY stage, to expose a straight linear pattern of protrusions and recesses on the entirety of a 3 mm square range of the photoresist layer. In addition, cruciform patterns, in which lines having line widths of 10 μm and lengths of 50 μm are crossed, were exposed at positions outside the four corners of the 3 mm square region.

Thereafter, the photoresist layer underwent a development process and the exposed portions were removed. Finally, selective etching was performed to a depth of 80 nm by RIE using the photoresist layer, from which the exposed portions were removed, as a mask, to obtain a Si mold having the straight linear pattern of protrusions and recesses and the cruciform alignment marks.

The surface of the Si mold was processed with Optool DSX by Daikin Industries K.K. to improve the mold release properties thereof.
(Resist)

A resist containing the compound represented by Chemical Formula 1 at 48 w %, Aronix M220 at 48 w %, IRGACURE 379 at 3 w %, and the compound represented by Chemical Formula 2 at 1 w % was prepared as the resist.
(Substrate)

A 0.525 mm thick quartz substrate was employed as a substrate. Cruciform alignment marks having the same dimensions as the alignment marks of the mold are formed at positions corresponding to the alignment marks of the mold in advance. The surface of the quartz substrate was processed with KBM-5103 (by Shin-Etsu Chemical Industries, K.K.), which is a silane coupling agent having superior close contact properties with respect to the resist. The KBM-5103 was diluted to 1% by mass using PGMEA, and coated on the surface of the substrate by the spin coat method. Thereafter, the coated substrate was annealed for 20 minutes at 120° C. on a hot plate, causing the silane coupling agent to bond to the surface of the substrate.
(Resist Coating Step)

DMP-2831, which is an ink jet printer of the piezoelectric type by FUJIFILM Dimatix, was utilized. DMC-11610, which is a dedicated 10 pl head, was utilized as an inkjet head. Ink expelling conditions were set and adjusted in advance such that the amount of resin in each droplet was 10 pl. After the droplet amount was adjusted in this manner, droplets were arranged on the substrate according to a predetermined droplet arrangement pattern. The droplet arrangement pattern was produced by the method described below.
(Droplet Arrangement Pattern Producing Step)

The droplet arrangement pattern was produced by the following procedures according to the simulation method described in the embodiments.

First, an analysis space was set on the mold as a target of analysis. An initial arrangement was determined with respect to the analysis space. Next, an initial fluid rate distribution was set within the analysis space based on the obtained initial arrangement, and simulation analysis of wet spreading and unions of droplets was executed. At this time, the wetting properties of the surface of the mold were imparted with anisotropy as wetting property parameters corresponding to the format of the pattern of protrusions and recesses thereon.

Figure 13A:
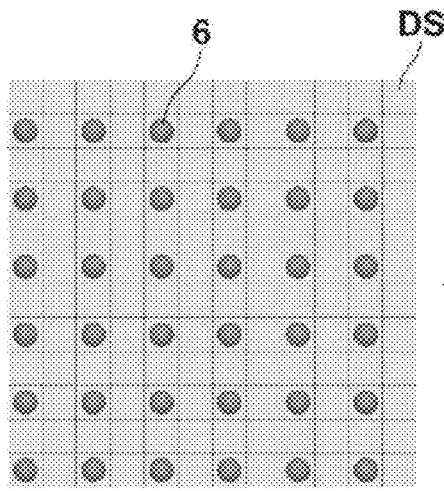
FIGS. 13A-13B are a collection of diagrams that illustrate the manner in which a plurality of droplets are initially arranged on an analysis surface having anisotropic wet spreading, and then analysis by simulation is executed.
Figure 13B:
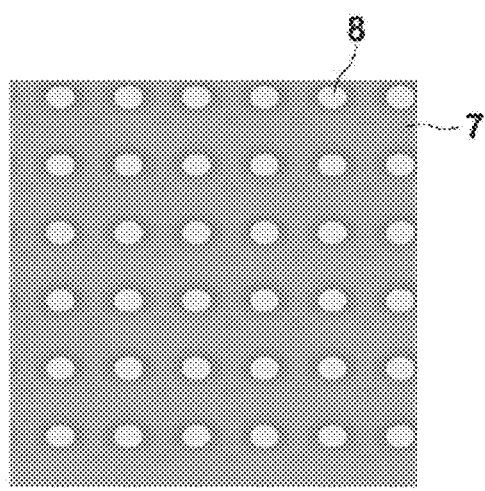

The number of droplets necessary for the 3 mm·3 mm analysis space was predicted to be 36, from the line pattern on the mold having the line widths of 60 nm and the pitches of 120 nm and a rough thickness 10 nm of residual film. As illustrated in A of FIG. 13, a plurality of droplets 6 were arranged on the analysis surface as a square lattice having lattice intervals of 500 μm as an initial droplet arrangement.

Figure 14A:
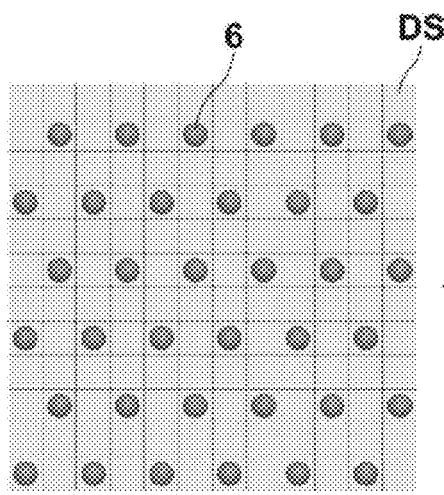
FIGS. 14A-14B are a collection of diagrams that illustrate the manner in which the arrangement of a plurality of droplets is corrected, and then analysis by simulation is executed.
Figure 14B:
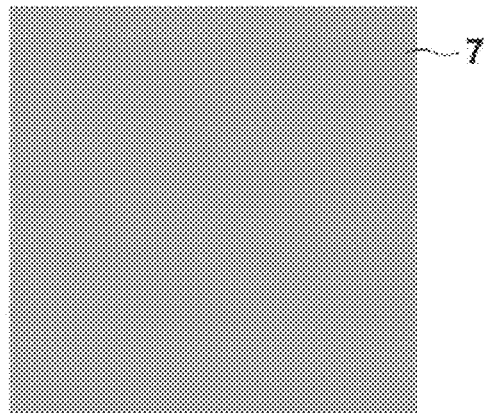

Then, simulation analysis of the initial droplet arrangement was executed by gas liquid two phase flow analysis. First, when the wetting property database was not used and anisotropy in wetting properties due to the pattern of protrusions and recesses was ignored, a uniform unified film was predicted. On the other hand, when the wetting property database was used and anisotropy in wetting properties due to the pattern of protrusions and recesses was taken into consideration, the droplets wet spread into ellipses, and a unified film 7 in which defects 8 due to residual gas are present was predicted, as illustrated in B of FIG. 13. The thickness of the residual film and defects due to residual gas were estimated from the obtained height distribution of the unified film, and the droplet arrangement was corrected. Ultimately, the droplet arrangement became that illustrated in A of FIG. 14. When simulation analysis was executed with respect to this arrangement, a uniform unified film 7 as illustrated in B of FIG. 14 having no fluctuations in the height distribution thereof and no defects due to residual gas was predicted. Thereby, it was confirmed that it is possible to predict a uniform unified film 7 even in the case that the analysis surface has anisotropic wetting properties due to the pattern of protrusions and recesses. A droplet arrangement which is appropriate for a case in which the mold has a pattern of protrusions and recesses was produced in the manner described above.

The above steps were executed by a program installed in a host computer of an ink jet printer.

(Mold Pressing Step)

The mold and the quartz substrate were caused to approach each other such that the gap therebetween was 0.1 mm or less, and positioning was performed from the rear surface of the quartz substrate such that the positions of the alignment marks on the quartz substrate matched the positions of the alignment marks on the mold. The space between the Si mold and the quartz substrate was replaced with a gas which is 99% He by volume or greater. Then, depressurization was performed to 20 kPa or less. The mold was caused to contact the droplets of resist under the depressurized He conditions. After contact, a pressure of 1 MPa was applied for one minute, and ultraviolet light including a wavelength of 360 nm as irradiated at a dosage of 300 mJ/cm$^2$, to cure the resist.

(Mold Release Step)

The outer edge portions of the quartz substrate and the mold were mechanically held or the rear surfaces thereof were held by suction. Then, the quartz substrate or the mold was relatively moved in a direction opposite the pressing direction to release and separate the mold.

(Substrate Processing Step)

Dry etching was performed as described below using the resist film, on which the pattern of protrusions and recesses is transferred, as a mask. Thereby, shapes of protrusions and recesses based on the pattern of protrusions and recesses of the resist film were formed on the quartz substrate, to obtain a quartz mold having a predetermined pattern of protrusions and recesses.

First, the residual film present at the recesses of the pattern was removed by oxygen plasma etching, to expose the quartz substrate at the recesses of the pattern. At this time, conditions were set such that the amount of etching is capable of removing the thickest residual film within the region of the pattern of protrusions and recesses. Next, RIE using a fluorine series gas was administered on the quartz substrate, using the protrusions of the pattern as a mask. The RIE conditions were set such that the depth of etching was 60 nm. Finally, the residue of the protrusions of the pattern was removed by oxygen plasma etching. The quartz mold, which is a copy of the Si mold, was produced by the above substrate processing step.

FIELD OF INDUSTRIAL APPLICABILITY

The embodiments and the example described above were for cases in which the present invention was utilized for nanoimprinting. However, the uses of the present invention are not limited to nanoimprinting. The present invention may also be applied to sealing techniques used in the fields of semiconductors and displays, for example.

What is claimed is:

1. A simulation method for predicting wet spreading and unions of a plurality of droplets arranged on a patterned surface defined by a pattern of protrusions and recesses, the patterned surface causing anisotropy to occur in the wet spreading of the droplets, comprising:
    a first step that sets an axis direction of the pattern according to the shape of the pattern of protrusions and recesses that defines the patterned surface on a modeled analysis surface of the patterned surface, which is a target of analysis;
    a second step that sets a plurality of modeled droplets on the analysis surface;
    a third step that refers to a wetting property database that has stored therein wetting property parameters that indicate wetting properties for a plurality of reference patterned surfaces and include a contact angle of droplets sticking to the reference patterned surfaces, each of the wetting property parameters corresponding to each of formats of patterns of protrusions and recesses that define the plurality of patterned surfaces, the formats of patterns comprise basic elements that define a scale of each pattern of protrusions and recesses;
    a fourth step that obtains wetting property parameters that correspond to one of the formats of the patterns of protrusions and recesses that defines one of the patterned surfaces, which is the target of analysis, based on the wetting property database;
    a fifth step that treats influence imparted by the pattern of protrusions and recesses that defines the patterned surface, which is the target of analysis, on the wet spreading of droplets as wetting properties of the analysis surface, and analyzes the wet spreading and unions of the plurality of droplets on the analysis surface by gas liquid two phase flow analysis that incorporates the obtained wetting property parameters; and
    a sixth step that outputs the analysis results obtained in the fifth step as a height distribution of a unified film formed by the plurality of droplets,
    wherein the wetting property parameters comprise a contact angle of the plurality of droplets sticking to the reference patterned surfaces.

2. A simulation method as defined in claim 1, wherein:
    the first step divides the patterned surface, which is the target of analysis, into a plurality of cells, modeling each cell as analysis cells that constitute the analysis surface, and sets the axis direction of the pattern for each analysis cell.

3. A simulation method as defined in claim 1, wherein:
    the wetting property parameters include the value of a contact angle $\theta_{cp}$, which is a contact angle of a contact line at which three phases of gas, liquid, and solid contact each other at a position where a direction of a vector normal to the contact line and the axis direction of the pattern are parallel to each other, and a contact angle $\theta_{cv}$ of the contact line at a position where the direction of the vector normal to the contact line and the axis direction of the pattern are perpendicular to each other; and
    the fifth step designates $\theta_c$ obtained by Formula 1 below, in which $\phi$ represents angles formed by the directions of vectors normal to the contact line and the axis direction of the pattern at positions along the contact line, as contact angles at positions along the contact line, and performs the gas liquid two phase flow analysis incorporating the wetting property parameters by correcting vectors normal to a gas liquid interface at the positions along the contact line such that angles formed by the vectors normal to the gas liquid interface and vectors normal to the analysis surface form the contact angles $\theta_c$ $$\theta_c = \theta_{cp} \cdot |\cos\phi| + \theta_{cr} \cdot |\sin\phi| \qquad 1.$$

4. A simulation method as defined in claim 3, wherein:
the first step divides the patterned surface, which is the target of analysis, into a plurality of cells, modeling each cell as analysis cells that constitute the analysis surface, and sets the axis direction of the pattern for each analysis cell.

5. A simulation method as defined in claim 3, wherein:
the second step arranges a number $n_{init}$ of droplets, which is less than or equal to a maximum number $n_{drop}$ determined by Formula 2 below, in which $V_{film}$ represents a desired volume of the unified film to be formed on the analysis surface, $V_{drop}$ represents the volume of each droplet, and int represents that digits below the decimal point are cut off from the numerical value within the parentheses, as the plurality of droplets;
the simulation method further comprises a seventh step that adjusts the arrangement of the plurality of droplets on the analysis surface and/or increases the number of the plurality of droplets within a range that does not exceed the maximum number $n_{drop}$ in the case that there are portions having heights that do not match a predetermined threshold height, in the height distribution obtained in the sixth step; and
the fifth step through the seventh step are repeatedly executed with respect to the plurality of droplets, the arrangement of which has been adjusted and/or the number of which has been increased, until there are no portions in the height distribution that have heights that do not match the predetermined threshold height, to optimize the arrangement of the plurality of droplets $$n_{drop} = \text{int}\left(\frac{V_{film}}{V_{drop}}\right). \qquad 2$$

6. A simulation method as defined in claim 5, further comprising:
an eighth step that produces a droplet arrangement pattern based on the optimized arrangement of the plurality of droplets obtained as analysis results by the last fifth step which is executed.

7. A simulation method as defined in claim 1, wherein:
the second step arranges a number $n_{init}$ of droplets, which is less than or equal to a maximum number $n_{drop}$ determined by Formula 2 below, in which $V_{film}$ represents a desired volume of the unified film to be formed on the analysis surface, $V_{drop}$ represents the volume of each droplet, and int represents that digits below the decimal point are cut off from the numerical value within the parentheses, as the plurality of droplets;
the simulation method further comprises a seventh step that adjusts the arrangement of the plurality of droplets on the analysis surface and/or increases the number of the plurality of droplets within a range that does not exceed the maximum number $n_{drop}$ in the case that there are portions having heights that do not match a predetermined threshold height, in the height distribution obtained in the sixth step; and
the fifth step through the seventh step are repeatedly executed with respect to the plurality of droplets, the arrangement of which has been adjusted and/or the number of which has been increased, until there are no portions in the height distribution that have heights that do not match the predetermined threshold height, to optimize the arrangement of the plurality of droplets $$n_{drop} = \text{int}\left(\frac{V_{film}}{V_{drop}}\right). \qquad 2$$

8. A simulation method as defined in claim 7, wherein:
the first step divides the patterned surface, which is the target of analysis, into a plurality of cells, modeling each cell as analysis cells that constitute the analysis surface, and sets the axis direction of the pattern for each analysis cell.

9. A simulation method as defined in claim 7, further comprising:
an eighth step that produces a droplet arrangement pattern based on the optimized arrangement of the plurality of droplets obtained as analysis results by the last fifth step which is executed.

10. A simulation method as defined in claim 9, wherein:
the first step divides the patterned surface, which is the target of analysis, into a plurality of cells, modeling each cell as analysis cells that constitute the analysis surface, and sets the axis direction of the pattern for each analysis cell.

* * * * *